(12) United States Patent
Kern et al.

(10) Patent No.: US 10,109,372 B2
(45) Date of Patent: Oct. 23, 2018

(54) MEMORY DEVICE AND METHOD FOR CORRECTING A STORED BIT SEQUENCE

(71) Applicant: Infineon Technologies AG, Neubiberg (DE)

(72) Inventors: Thomas Kern, Aschheim (DE); Michael Goessel, Mahlow (DE); Karl Hofmann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/235,741

(22) Filed: Aug. 12, 2016

(65) Prior Publication Data
US 2017/0046223 A1   Feb. 16, 2017

(30) Foreign Application Priority Data
Aug. 12, 2015   (DE) .......................... 10 2015 215 401

(51) Int. Cl.
| | |
|---|---|
| G11C 29/00 | (2006.01) |
| G11C 29/52 | (2006.01) |
| G11C 29/42 | (2006.01) |
| G11C 11/16 | (2006.01) |
| G11C 29/04 | (2006.01) |

(52) U.S. Cl.
CPC .......... G11C 29/52 (2013.01); G11C 11/1677 (2013.01); G11C 29/42 (2013.01); G11C 2029/0409 (2013.01)

(58) Field of Classification Search
CPC .. G06F 11/1068; G06F 11/1677; G11C 29/42; G11C 29/52
See application file for complete search history.

(56) References Cited

U.S. PATENT DOCUMENTS

| | | | | |
|---|---|---|---|---|
| 7,099,190 | B2 * | 8/2006 | Noguchi | G06F 11/1008 365/185.03 |
| 7,865,797 | B2 * | 1/2011 | Eguchi | G11C 16/28 714/752 |
| 7,920,423 | B1 * | 4/2011 | Ma | G11C 16/0433 365/185.04 |

(Continued)

FOREIGN PATENT DOCUMENTS

| | | |
|---|---|---|
| JP | H04324551 A | 11/1992 |
| JP | 2009223941 A | 10/2009 |
| JP | 2013125303 A | 6/2013 |

*Primary Examiner* — Esaw T Abraham
(74) *Attorney, Agent, or Firm* — Escweiler & Potashnik, LLC

(57) ABSTRACT

A memory device includes a memory with first memory cells and second memory cells, which are different from the first memory cells. In the first memory cells there is stored a first bit sequence and in the second memory cells there is stored a second bit sequence. The memory device includes a memory controller, which is configured to check the first bit sequence with a frequency (x1/T) assigned to the first memory cells. The frequency (x1/T) assigned to the first memory cells depends on an item of reliability information for the first memory cells. The memory controller is configured in the case of an error state to correct an erroneous bit of the first bit sequence and to write back at least the corrected bit into the memory. The second bit sequence is checked less often than the first bit sequence on the basis of an item of reliability information for the second memory cells.

28 Claims, 14 Drawing Sheets

(56) References Cited

U.S. PATENT DOCUMENTS

| | | |
|---|---|---|
| 8,050,095 B2 | 11/2011 | Gonzalez |
| 8,793,555 B2 | 7/2014 | Hida et al. |
| 2016/0026533 A1* | 1/2016 | Ishikawa ............. G06F 11/1441 |
| | | 714/6.2 |

* cited by examiner

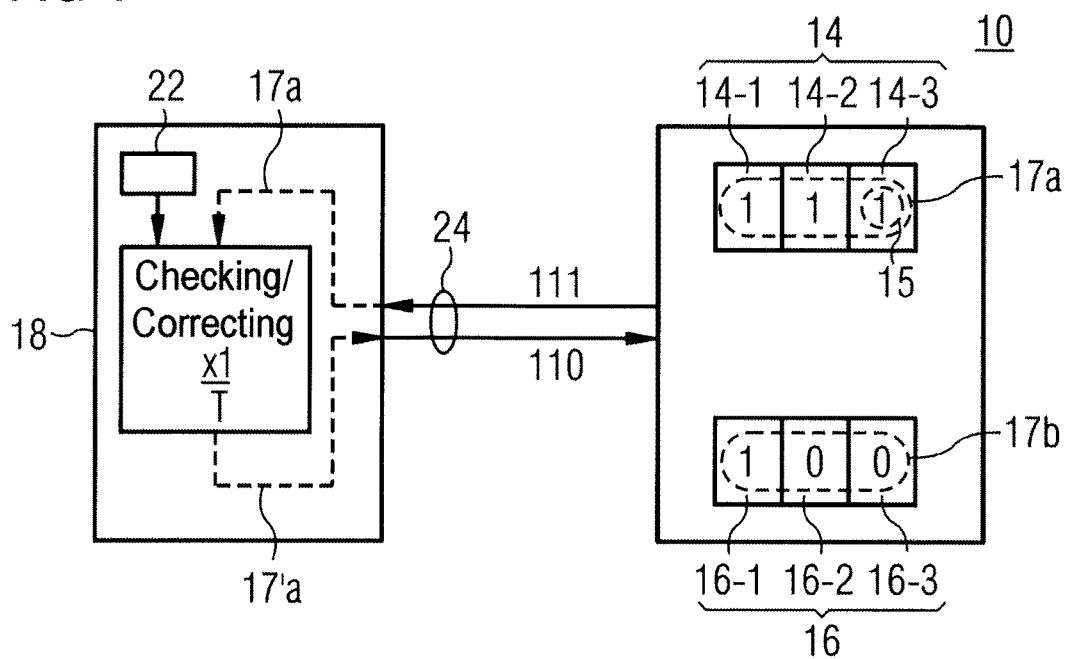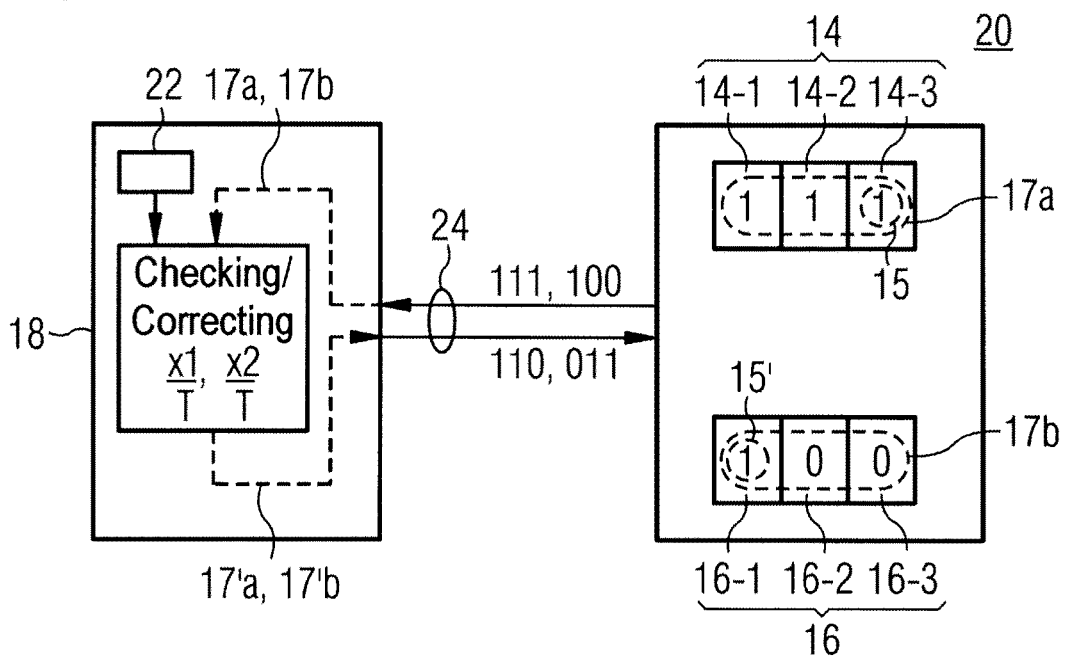

| Address | Check bits | Data bits |
|---|---|---|
| $a^0$ | $c^0$ | $u^0$ | 42', 42 |
| $a^1$ | $c^1$ | $u^1$ |
| ⋮ | | |
| $a^{2^\ell-1}$ | $c^{2^\ell-1}$ | $u^{2^\ell-1}$ |

| | $a_0\ a_1\ a_2$ | $c_0\ c_1\ c_2\ c_3\ c_4$ | $u_0\ u_1\ u_2\ u_3\ u_4\ u_5\ u_6$ | |
|---|---|---|---|---|
| | 0 0 0 | | | |
| | 0 0 1 | | | |
| a1,1: | 0 1 0 | 1 0 1 1 0 | 1 0 1 0 0 1 0 | 44a, 14a |
| | 0 1 1 | | | |
| | 1 0 0 | | | |
| a2,1: | 1 0 1 | 0 0 1 0 1 | 1 1 0 1 1 0 0 | 44b, 16a |
| a2,2: | 1 1 0 | | | 16b |
| a1,2: | 1 1 1 | | | 14b |

FIG 9

|  | $a_0\ a_1\ a_2$ | $c_0\ c_1\ c_2\ c_3\ c_4$ | $u_0\ u_1\ u_2\ u_3\ u_4\ u_5\ u_6$ | |
|---|---|---|---|---|
| | 0 0 0 | | | |
| | 0 0 1 | 14-2 | | |
| a1,1: | 0 1 0 | 1 1 1 0 1 | 1 0 1 0 0 1 0 | ← 44'a |
| | 0 1 1 | | | |
| | 1 0 0 | | | |
| a2,1: | 1 0 1 | 0 1 1 1 1 | 1 1 0 1 1 0 0 | ← 44'b |
| | 1 1 0 | | | |
| | 1 1 1 | | | |

| $a_0\ a_1\ a_2$ | $c_0\ c_1\ c_2\ c_3\ c_4$ | $u_0\ u_1\ u_2\ u_3\ u_4\ u_5\ u_6$ |
|---|---|---|
| 0 0 0 | | |
| 0 0 1 | | |
| a1,1: 0 1 0 | 1 1 0 1 1 | 1 0 1 0 0 1 0 |
| 0 1 1 | | |
| 1 0 0 | | |
| a2,1: 1 0 1 | 0 0 1 0 1 | 1 1 0 1 1 0 0 |
| 1 1 0 | | |
| 1 1 1 | | |

| | |
|---|---|
| $a^0$ | $w_0$ |
| $a^1$ | $w_1$ |
| $a^2$ | $w_2$ |
| ⋮ | ⋮ |
| $a^{31}$ | $w_{31}$ |

FIG 17
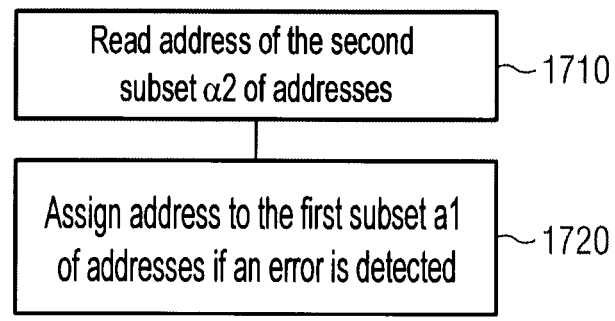
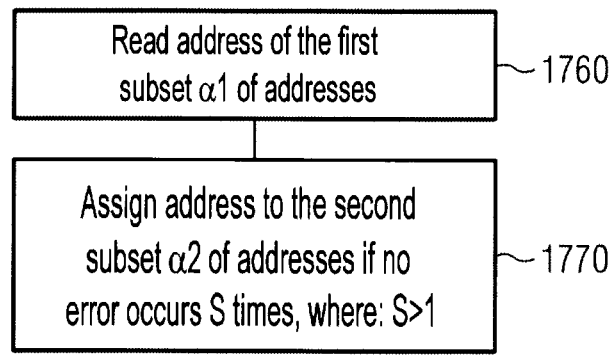
FIG 18
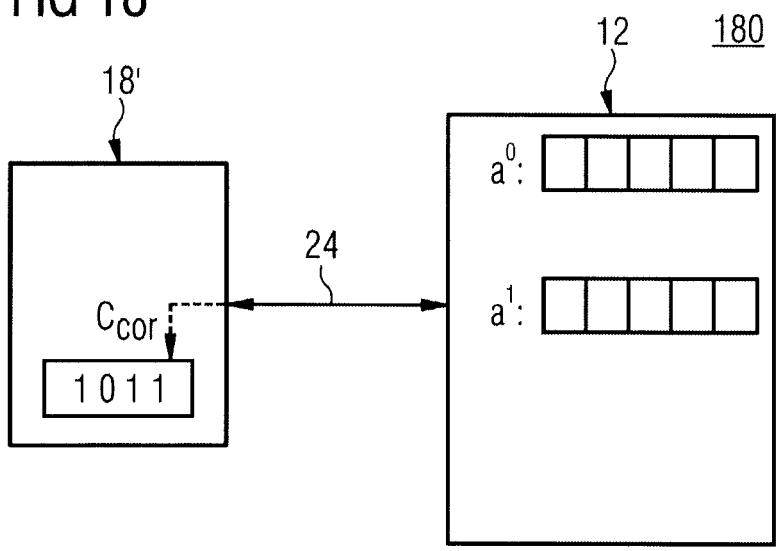

Checking a first bit sequence, which is stored in first memory cells of a memory, the memory having second memory cells, which are different from the first memory cells and in which there is stored a second bit sequence, the first bit sequence being checked with a frequency that is assigned to the first memory cells and is dependent on an item of reliability information for the first memory cells, in the case of an error state an erroneous bit of the first bit sequence being corrected and at least the corrected bit being written back into the memory, and the second bit sequence being checked less often than the first bit sequence on the basis of an item of reliability information for the second memory cells. ~2110

Storing bit sequences in an addressable memory that has first memory cells, which are addressed by a first address $\alpha 1,1$, and that has second memory cells, which are addressed by a second address $\alpha 2,1$, which is different from the first address, the bit sequences stored under the first address $\alpha 1,1$ and the second address $\alpha 2,1$ in the error-free case respectively being bits of a code word of an error-correcting code. ~2210

Reading out the first and/or second memory cells to provide for a correction of erroneous contents in the stored bit sequences by implementing a reading-out operation, a frequency of successive operations of reading out the first memory cells and the second memory cells being different if an item of reliability information is available for the first memory cells and/or the second memory cells, the reliability information being based on an ascertained probability of an occurrence of an erroneous bit sequence in the first memory cells and/or the second memory cells. ~2220

FIG 24
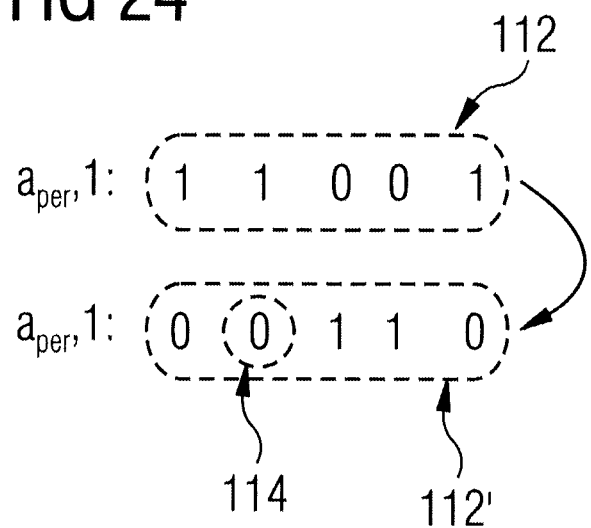
FIG 25
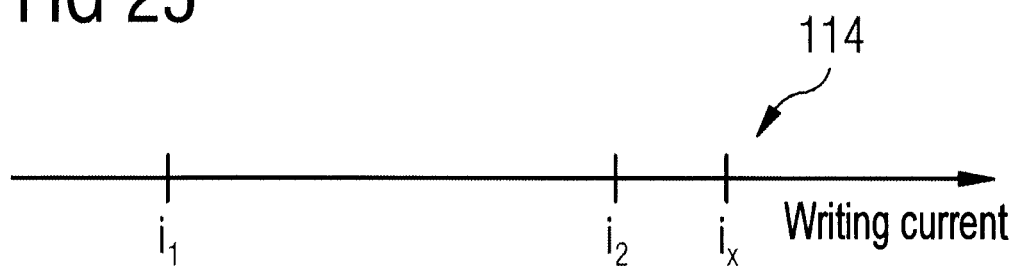
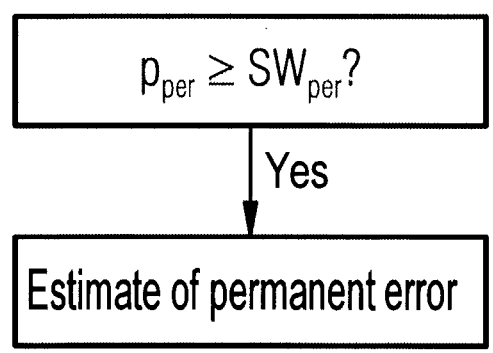

MEMORY DEVICE AND METHOD FOR CORRECTING A STORED BIT SEQUENCE

CROSS REFERENCE TO RELATED APPLICATIONS

This application claims priority to German Application number 10 2015 215 401.7, filed on Aug. 12, 2015, the contents of which are herein incorporated by reference in its entirety.

FIELD

The present disclosure relates to memory devices and to methods for correcting a stored bit sequence. The present disclosure also relates to an address-dependent restoration of erroneous memory contents.

BACKGROUND

Information memories or memories for storing bit sequences may have a plurality or multiplicity of memory cells. In the case of addressable memories, a memory cell or group of memory cells may be addressed on the basis of an address, i.e. a read access and/or a write access to the memory cells may take place. The memory cells may be designed to store items of information in a volatile and/or nonvolatile state. Bit sequences stored in a memory may have a bit error.

SUMMARY

Example embodiments provide a memory device comprising a memory that has first memory cells and second memory cells. The second memory cells are different from the first memory cells. In the first memory cells there may be stored a first bit sequence and in the second memory cells there may be stored a second bit sequence. The memory device comprises a memory controller, which is designed to check the first bit sequence with a frequency assigned to the first memory cells. The frequency assigned to the first memory cells depends on an item of reliability information for the first memory cells. The memory controller is designed in the case of an error state to correct an erroneous bit of the first bit sequence and to write at least the corrected bit back into the memory. The second bit sequence is checked less often than the first bit sequence on the basis of an item of reliability information for the second memory cells.

Further example embodiments provide a memory device comprising an addressable memory for storing bit sequences and a memory controller. In the error-free case, the stored bit sequences are respectively bits of a code word of an error-correcting code. The memory controller is designed to provide for a correction of erroneous contents by reading out the stored bit sequences in order to carry out a reading-out operation. The error-correcting code is a t-bit correcting code, where $t \geq 2$. The memory controller is designed to correct a stored and read-out erroneous bit sequence that has a number of $\sigma$ errors by using the error-correcting code and to overwrite the erroneous bit sequence with a corrected bit sequence and/or to write back the corrected bit sequence, where $1 \leq \tau < \sigma \leq t$. The memory controller is designed not to overwrite the erroneous bit sequence with a corrected bit sequence and not to write back the corrected bit sequence if the read-out bit sequence has a number of $\sigma$ errors and if $\sigma \leq \tau$.

Further example embodiments provide methods for correcting bit sequences.

Further advantageous embodiments are the subject of the dependent patent claims.

DETAILED DESCRIPTION OF THE DRAWINGS

Example embodiments of the present disclosure are explained below with reference to the accompanying drawings, in which:

FIG. 1 shows a schematic block diagram of a memory device according to an example embodiment;

FIG. 2 shows a schematic block diagram of a memory device that is modified in comparison with FIG. 1, according to an example embodiment;

FIG. 7 shows a schematic diagram with an assignment of memory cells to addresses of the memory according to an example embodiment;

FIG. 8 shows a schematic representation of bit sequences stored under the addresses from FIG. 7 according to an example embodiment;

FIG. 9 shows a schematic representation of the memory from FIG. 7, which has a stored code word, according to an example embodiment;

FIG. 10 shows a schematic representation of the memory 12, in which the parity is used for the forming of code words, according to an example embodiment;

FIG. 11 shows a schematic representation of an addressable memory with 32 addresses according to an example embodiment;

Figure 12:
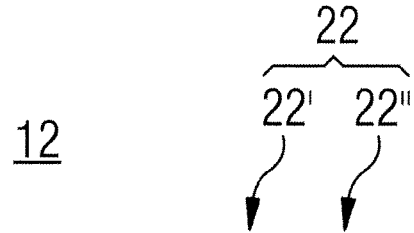
Figure 13:
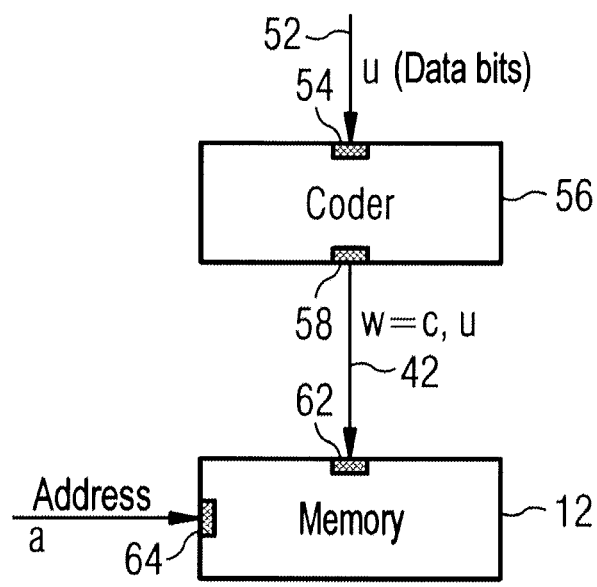
Figure 14:
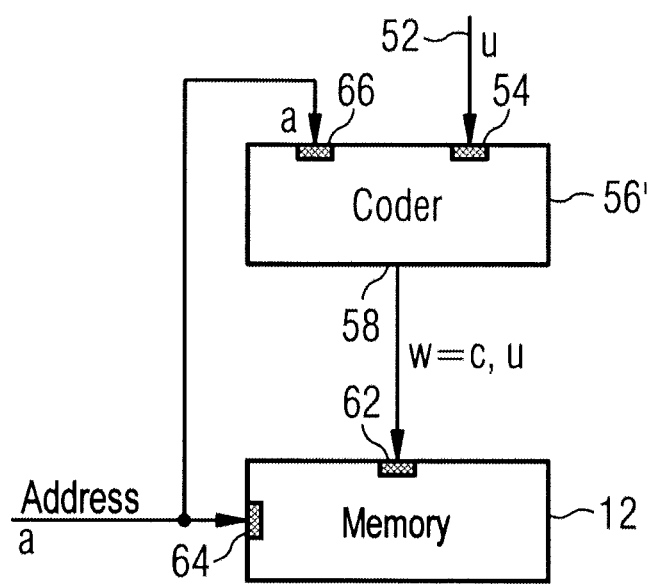
Figure 15:
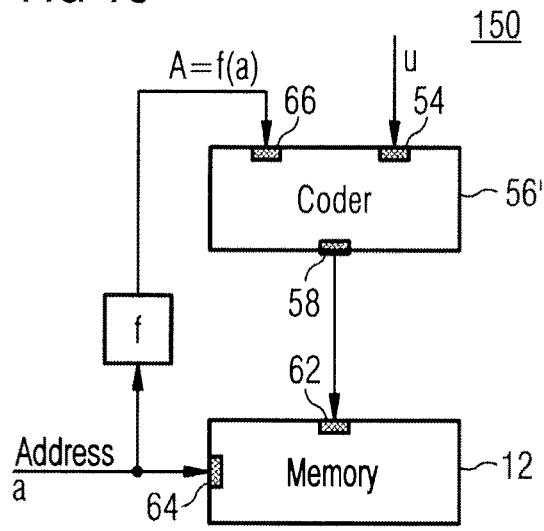
Figure 16:
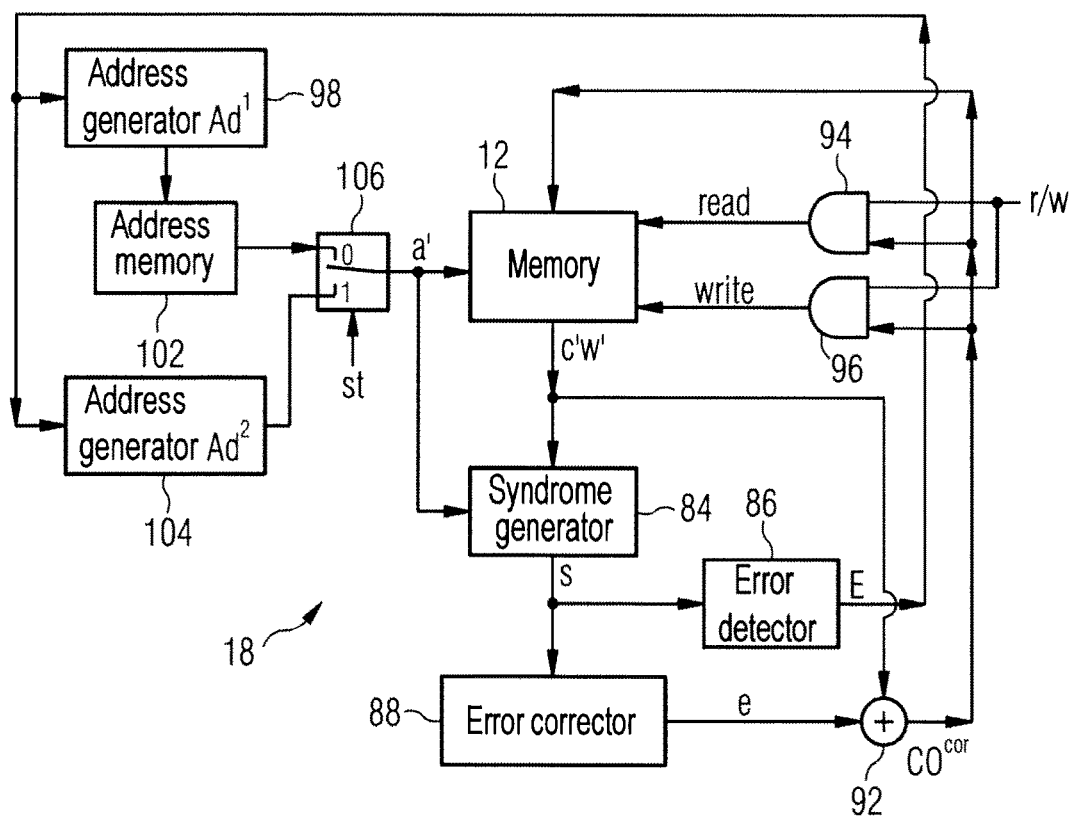
Figure 19:
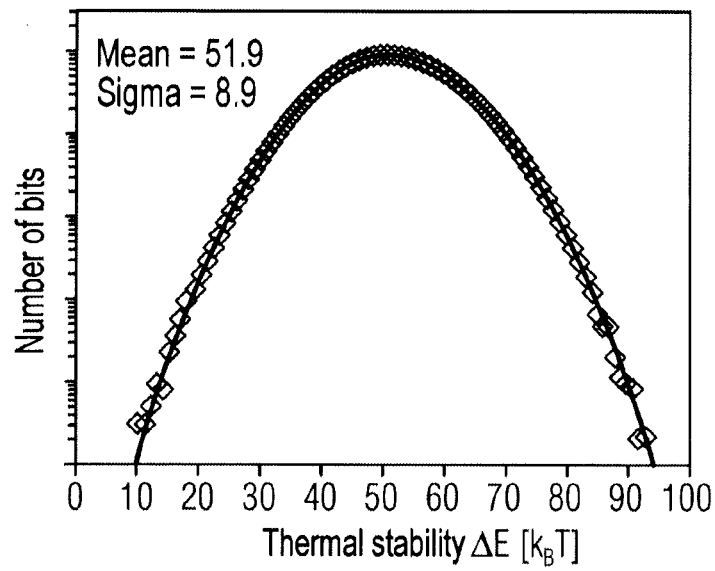
Figure 20:
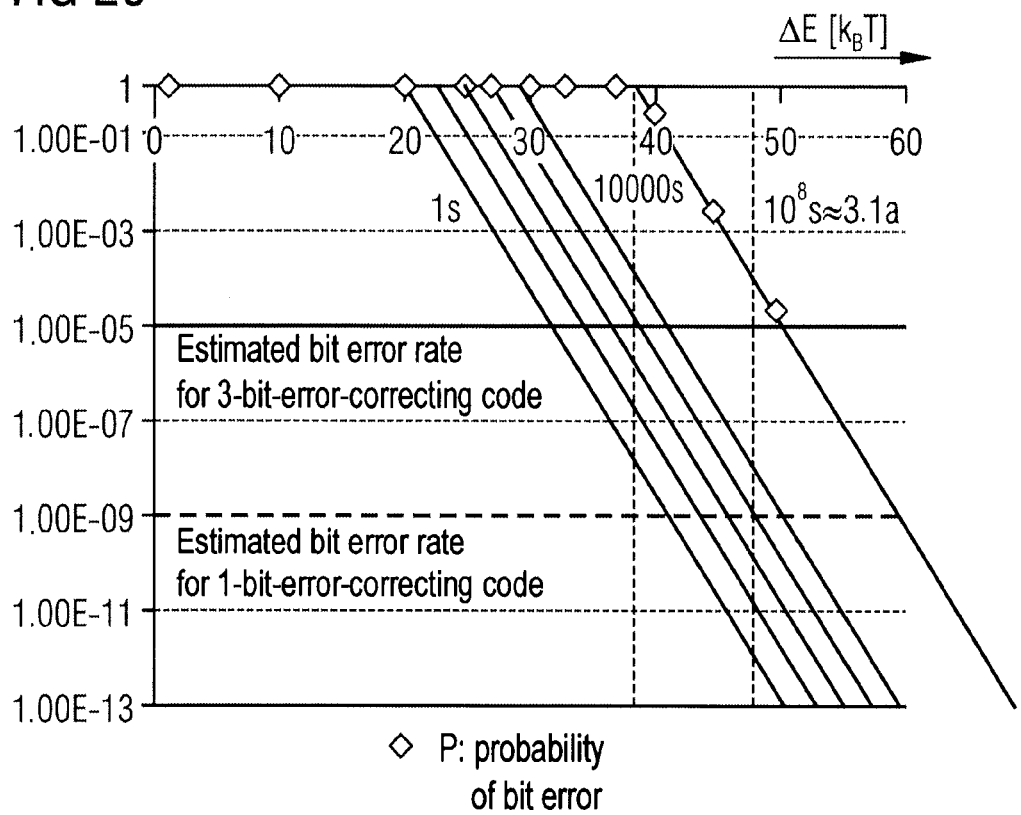
Figure 23:
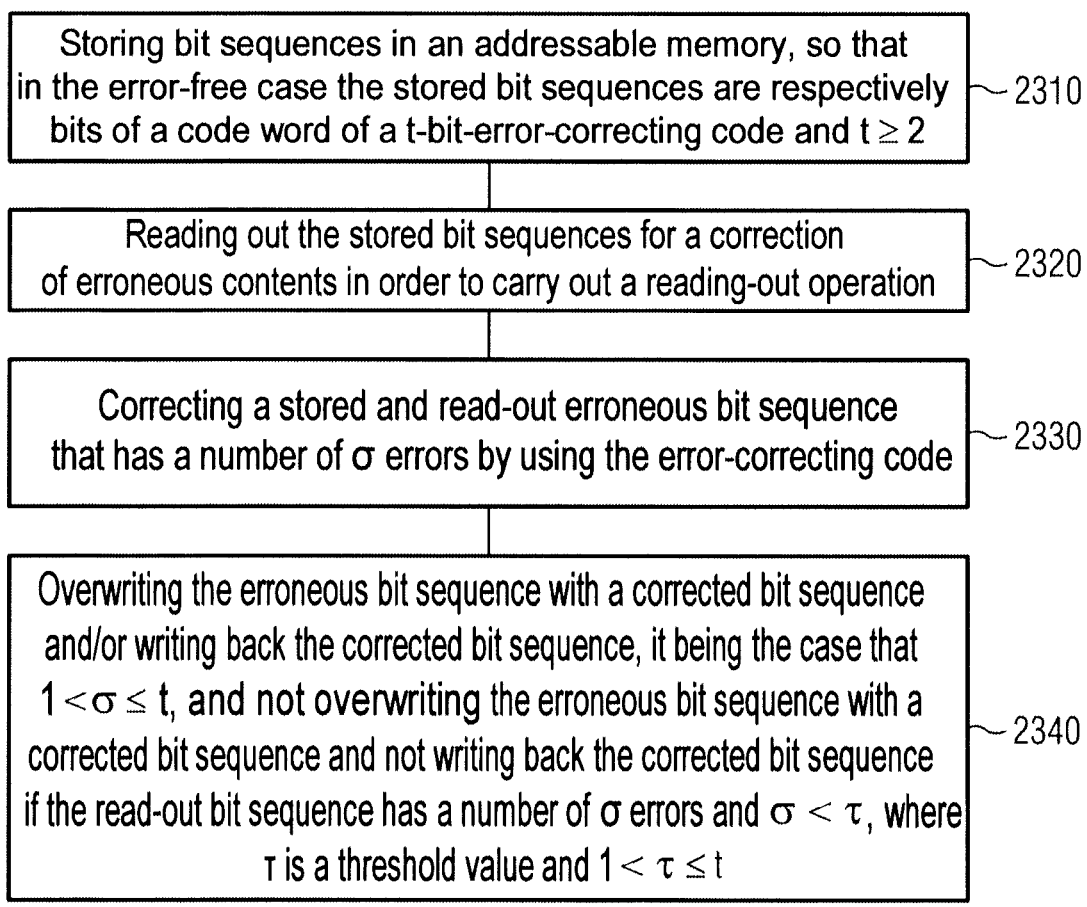

FIG. 12 schematically shows the occupation of a memory according to an example embodiment;

FIG. 13 shows a schematic block diagram of a circuit arrangement for storing coded data in the addressable memory according to an example embodiment;

FIG. 14 shows a schematic block diagram of a further memory device for storing coded data in the addressable memory, according to an example embodiment;

FIG. 15 shows a schematic block diagram of a memory device for storing coded useful data in the addressable memory in which information is derived from address bits, according to an example embodiment;

FIG. 16 shows a schematic block diagram of a memory device comprising the addressable memory and the memory controller, according to an example embodiment;

FIG. 17 shows a schematic flow diagram of methods that can be implemented to influence or change an assignment of addresses to a subset, according to an example embodiment;

FIG. 18 shows a schematic block diagram of a memory device which comprises a modified memory controller, according to an example embodiment;

FIG. 19 shows a schematic representation of a distribution of memory cells over various thermal stabilities according to an example embodiment;

FIG. 20 shows a schematic diagram of a probability distribution that has a bit within a time interval or a bit error after a writing operation, according to an example embodiment;

FIG. 21 shows a schematic flow diagram of a method for error correction, as can be implemented for example by the memory device according to FIG. 1, according to an example embodiment;

FIG. 22 shows a schematic flow diagram of a method for error correction according to an example embodiment;

FIG. 23 shows a schematic flow diagram of a method, as can be implemented for example by the memory device from FIG. 18, according to an example embodiment;

FIG. 24 shows a schematic representation of a bit sequence to be stored, which is stored as a bitwise-inverted bit sequence, according to an example embodiment; and FIG. 25 shows a schematic representation of a classification of the memory cell as having a permanent error according to an example embodiment.

DETAILED DESCRIPTION

Before example embodiments of the present disclosure are explained below more specifically in detail on the basis of the drawings, it is pointed out that elements, objects and/or structures that are identical, functionally the same or have the same effect are provided with the same designations in the various figures, so that the descriptions of these elements presented in various example embodiments can be exchanged with one another or can be applied to one another.

The following embodiments relate to reading one or several bit sequences from a memory and/or to writing bits or bit sequences to a memory. Although the term writing is used, writing may also characterize the processes of clearing and/or programming the memory, which are common in non-volatile memories, since a process of clearing with subsequent programming may also be understood to be a process of writing one or several bits of the memory.

The inventors have discovered that a time, a computing power and/or an expenditure of energy of a memory device is low if a bit sequence is checked for the presence of an error on the basis of an ascertained probability of an occurrence of an erroneous bit sequence. For a low probability, a low frequency, i.e. a great time interval between two checks, may be chosen, whereas, for a high probability, a high frequency, i.e. a small time interval, may be chosen. A check of bit sequences with a low probability makes a saving of time, computing power and/or electrical energy possible, so that the memory device can be operated with high efficiency and little or no sacrifices with respect to the reliability of the stored information.

Subsequent example embodiments relate to memory devices with a memory that may be addressable. Addressable memories may be designed to store information in a volatile or nonvolatile state. For this, one or more memory cells may be addressed by using an address of the memory. In the memory cell, information may be stored and/or read out. Volatile memories may be usable for example as cache memories or as RAM memories. Nonvolatile memories may be for example flash memories, hard disks, floppy disks, CDs (compact disks), DVDs (digital video/versatile disks), data tapes or the like. In particular, nonvolatile memories may be a magnetoresistive memory with direct access (MRAM).

Some of the example embodiments explained below relate to use of an item of reliability information for determining or establishing a frequency with which the bit sequences are checked for a presence of bit errors. A respective item of reliability information may be assigned to a respective memory cell and for example be determinable on the basis of a physical parameter or be the physical parameter. The physical parameter may comprise for example a reading current of the memory cell, a writing current of the memory cell, a thermal stability of the memory cell and/or a further/another parameter that is correlated with the thermal stability. The physical parameter may influence a probability of an occurrence of a bit error/flipping of a bit in the memory cell within a time interval. Consequently, a statement as to how reliably (permanently) information can be stored in the respective memory cell can be derived from the physical parameter. The statement may be understood as meaning in simplified terms that a differentiation is possible between "good", i.e. reliable, and "bad", i.e. less reliable, memory cells, while other or further differentiations or sub-groupings are likewise possible. At a point in time after production of a memory, the physical parameter for each memory cell of the memory may be recorded. The reliability information can be obtained or derived from the physical parameter directly or indirectly, for instance on the basis of a computing operation or a threshold value comparison. This means that recording the physical parameter for a memory cell also makes available the reliability information for the memory cell.

The reliability information may be based on the physical parameter and indicate information as to how probable an occurrence of a bit error in the memory cell is. In addressable memories, such as for instance MRAM memories, a number of memory cells may be addressable by a common memory address. The reliability information of the individual memory cells may be aggregated or combined in an item of reliability information of the number of memory cells of an address. An item of reliability information for a number of memory cells that are addressable by a common memory address may be based on how reliable the best or worst memory cell of the number of memory cells is.

For simplicity, some of the example embodiments described below are described such that an item of reliability information is available for a memory cell or a group of memory cells as stored information that can be assigned to the memory cells. These explanations serve for better understanding, but are not intended to restrict the example embodiments to the extent that the stored information is the reliability information. Rather, the reliability information is to be understood as meaning a decision concerning the reliability of a memory cell or a memory cell group on the basis of the recording of the physical parameter. A result of the decision may take the form of storing or not storing a corresponding item of information. Consequently, in the case of a grouping of the memory cells into a number of groups (for instance good/bad), at least one group may be identified by an absence of a corresponding item of information although the reliability information is available or has been determined for this group.

Some of the example embodiments explained below relate to an addressable memory that has an MRAM memory. The MRAM memory may have a plurality or multiplicity of memory cells. One or more memory cells may be respectively addressed by an address that refers to the memory cell(s). On the basis of a read access to the at least one memory cell by using the address, an item of information that is stored in the at least one memory cell can be read out. On the basis of a write access, an item of information can be stored in the at least one memory cell, for example by means of writing or rewriting at least one memory cell from a state of logical zero to logical one, or vice versa.

An overwriting of the erroneous bit sequence with a corrected bit sequence may relate to an overwriting or renewed writing of memory cells read out under the same address. A writing back or rewriting into the memory may relate to storing of the corrected bit sequence under an address that is different from that address. Alternatively, the two terms may be used interchangeably. Both writing back and overwriting may be understood to be clearing and/or programming at least bits of the memory.

Some of the example embodiments described below relate to an error-identifying and/or an error-correcting code and the use thereof. Codes may have a plurality or multiplicity of code words that can be understood as a valid bit combination within the code. Codes may have a code distance (minimum distance), for instance a $\Delta$ distance or a Hamming distance. The code distance may be understood as a measure of a number of errors or bit errors that can occur within a code word without the erroneous code word representing another code word. On the basis of the code distance, the code can be used to identify a presence of errors and, if applicable, a number of errors in the bit sequence. On the basis of the minimum distance, furthermore, at least one error in an erroneous bit sequence may be correctable. This can also be understood as meaning that a code with a code distance of d can be used to identify a number of (d−1) errors and/or to correct a number of k errors, where k<d/2. With a code that has a code distance of d=3, a number of 2 (bit) errors may for example be identifiable. Alternatively or in addition, the code may be usable for correcting a number of k=1 errors.

Items of information stored in a memory may have errors due to an erroneous write access, due to influences acting on the memory and/or due to properties of the memory. In electronic memory elements, digital values may be stored in memory cells for example as analog values, for instance as charges or resistances. The analog values may be converted into digital values during the reading out of the memory elements, as is possible for example in a flash memory or a DRAM (dynamic RAM). The analog memory states may change over time. If for example a state is stored as a charge, the charge may be reduced by leakage currents and/or diffusion. In order to prevent the charge from falling below a certain threshold value, and consequently the items of information stored in the memory cells being erroneously interpreted, in a flash memory or a DRAM the data may for instance be periodically written back into the same memory cells. After the renewed writing in, the analog state values may be sufficiently far away from the threshold value again.

As a difference from this, in magnetoresistive memory elements (MRAMs) digital information may be stored digitally in the memory cells, by for example two states that are different from one another, for instance two states that are based on magnetic anisotropy. The stability of these states may depend on an energy barrier $\Delta E$ between the states, which may be referred to as thermal stability.

It is possible according to example embodiments that a digital state of a memory cell is disturbed in another likewise digital state (for example by quantum effects), i.e. there is an error. A probability $p_{stable}$ that a digital state of a cell is correct at a point in time t+$\Delta$t if it was correct at the point in time t can be described by a relationship $$p_{stable} = \exp\left(\frac{-\Delta t}{\tau}\right) \text{ with } \tau = \tau_0 \cdot \exp\left(\frac{\Delta E}{k_R \cdot T_{abs}}\right).$$

In this case, $k_B$ is the Boltzmann constant, $T_{abs}$ the absolute temperature, $\Delta E$ the thermal stability and $\tau_0$ a time constant with $\tau_0 \approx 1$ ns. A probability $p_{error}$ that a memory cell is erroneous at a point in time t+$\Delta$t if it was correct at the point in time t can be determined by $$P_{error} = 1 - p_{stable}.$$

The parameter $\tau$ depends for example exponentially on the thermal stability $\Delta E$. The probability $p_{stable}$ may for example for its part depend exponentially on $\tau$, so that the thermal stability $\Delta E$ can determine the stability of memory cells by way of two exponential functions. As a result, minor fluctuations of the thermal stability of the memory cells possibly have a strong effect on the stability of the memory cells of an MRAM memory.

It is difficult or not possible to improve the correctness of the data stored in the memory cells of an MRAM memory by for instance the contents of the memory cells being periodically read out and written back unchanged in order to prevent the accumulation of errors in an MRAM.

According to an example embodiment, the memory contents may be corrected by using an error-correcting code. Under the addresses of the MRAM, bit sequences or binary sequences may be stored as code words of an error-correcting code and periodically read out. Erroneous code words may be corrected during the periodic reading out and written back in corrected form into the corresponding cells of the MRAM. Consequently, digital errors in the memory cells can be corrected before too many errors accumulate.

On account of fluctuations in the thermal stability of the memory cells, their stability can vary greatly on the basis of the dual exponential dependence on the thermal stability $\Delta E$.

Some of the example embodiments described below describe devices or memories during operation of the same. Blocks or components of the respective device or of the memory are designed to provide the functionality described.

FIG. 1 shows a schematic block diagram of a memory device 10. The memory device 10 comprises a memory 12. The memory 12 may have first memory cells 14-1 to 14-3 or 14 and second memory cells 16-1 to 16-3 or 16. The first memory cells 14 and the second memory cells 16 may be different from one another, so that in the first memory cells 14 and the second memory cells 16 there can be stored bit sequences 17a and 17b that are different from one another. For example, in the first memory cells 14 the bit sequence 17a may be stored and in the second memory cells the bit sequence 17b may be stored.

The memory device 10 comprises a memory controller 18. The memory controller 18 is designed to check the bit sequence 17a with a frequency x1/T, where x1 may describe a number of reading-out operations or checking operations T may describe any desired time interval. The frequency x1/T may be assigned to the first memory cells. The frequency x1/T assigned to the first memory cells 14 may depend on an item of reliability information 22 for the first memory cells 14.

The reliability information 22 may provide an indication of the reliability of the first memory cells 14. For example, the memory 12 may be an addressable memory and the reliability information 22 may refer to an address of the first memory cells 14 or comprise the address.

The memory controller 18 may be designed in the case of an error state to correct an erroneous bit, for example a bit 15 stored in the memory cell 14-3, of the first bit sequence. The correction may comprise a correction of at least one bit. On the basis of the correction of the bit sequence 17a, a corrected bit sequence 17'a, which may have a smaller number of bit errors or no bit errors, can be obtained. The memory controller 18 may be designed to write back at least the corrected bit into the memory 12. For example, the memory controller 18 may be designed to write back the corrected bit sequence 17'a into the memory 12. According to further example embodiments, the memory controller 18 may be designed to write back at least one corrected bit into the memory 12. This may be understood as meaning that an erroneous bit, for example the bit 15 stored in the memory cell 14-3 with an information "1", is written back into the memory 12 as a corrected bit "0" and that an error-free bit is not written back into the memory.

On the basis of the reliability information for the second memory cells 14, the second bit sequence 17b may be checked less often than the first bit sequence 17a. For example, on the basis of a determination of the reliability, i.e. the reliability information for the second memory cells, an item of information may be stored or no information stored. According to an example embodiment, the reliability information for the first memory cells 14 is determined such that they are classified as unreliable, while the reliability information for the second memory cells 16 is determined such that they are classified as reliable. Storing an item of information (reliability information 22) that allows an identification or addressing of the first or second memory cells consequently also makes possible an identification or addressing of the other memory cells.

According to an example embodiment, at least one of the memory cells 14-1 to 14-3 may be identified or known as being susceptible to errors, for instance by ascertaining the reliability information. For example, the memory cell 14-3 is known as being susceptible to errors, i.e. the memory cell 14-3 has an increased probability in comparison with other memory cells (reference cells) of having a bit error within a time interval t+Δt, i.e. of falsifying stored information. The reliability information 22 may provide an indication that the bit sequence 17a, which comprises the bit stored in the memory cell 14-3, will become erroneous within the time interval t+Δt or is erroneous (with a high probability) at the end of the same. This means that the reliability information 22 may be based on a probability of an occurrence of a bit error in the first memory cells 14 and/or the second memory cells 16. For example, the reliability information may be based or depend on an absolute probability of the first or second memory cells 14 or 16 having at least one bit error within the time interval. Alternatively or in addition, the reliability information may be based or depend on a relative probability, i.e. an occurrence of the bit error is more probable in one bit sequence than in another.

For example, the memory cells 14-1 to 14-3 may be used together, for instance on the basis of a common memory address, so that an error susceptibility of the memory cell 14-3 is transferable to the memory cells 14. Expressed in simplified terms, the memory cell 14-3, and consequently the first memory cells 14, may be understood as susceptible to errors or "bad" and other memory cells 14-1, 14-2 and/or 16 may be understood as "in order" or "good". The reliability information may provide an indication of good or bad memory cells, so that the other category respectively can be derived. According to further example embodiments, for each category there may be partial reliability information, so that the reliability information 22 can be understood as being overall information made up of partial reliability information.

The memory controller may be designed to determine whether an error state exists for the first bit sequence. The error state may relate to the presence of at least one bit error in the bit sequence 17a. According to example embodiments, the bit sequence 17a may be at least part of a code word of an error-correcting code, that means it may comprise bits of the code word or be the code word. The error-correcting code may be usable for correcting a number of t bit errors in a code word. For example, t≥1 or ≥2 or greater. If for example t≥2, the memory controller may be designed to determine that the error state exists if there are at least two bit errors and to determine that no error state exists if there is a number of ZERO errors or a number of one error. This may also be understood as use of a code reserve. This means that, according to example embodiments, errors may be corrected whenever there is a certain number of the same. If there is a smaller number, the memory controller 18 may be designed to dispense with a correction, since a further number (for example of at least ZERO errors or at least one error) is correctable. This makes it possible to save writing operations, and consequently time and/or energy, in comparison with a correction of each individual bit error when it occurs.

FIG. 2 shows a schematic block diagram of a memory device 20, which may have a functionality according to the memory device 10 and is modified with respect to the memory device 10. For example, the memory controller 18 may be designed on the basis of the reliability information 22 to check the second bit sequence 17b with a frequency x2/T assigned to the second memory cells 16. The value x1 may be understood as meaning a number of reading-out operations for the second memory cells or operations of checking the bit sequence 17b that are implemented within the time interval T. The number of x2 may comprise a value that is less than the number x1. For example, the number x2 may comprise a value of ZERO, which means that the memory controller 18 may be designed to exclude the second bit sequence 17b from a check on the basis of the reliability information 22.

If a reading-out operation or an operation of checking the second bit sequence 17b is implemented, the memory controller 18 may be designed to check whether an error state exists with respect to the second bit sequence 17b. The criteria for an error state of the second bit sequence 17b to exist and the criteria for an error state of the first bit sequence 17a to exist may be the same or comparable. If an error state of the second bit sequence 17b exists, the memory controller 18 may be designed to correct at least one erroneous bit of the second bit sequence, for example the bit 15' stored in the memory cell 16-1, and to write back the corrected bit sequence 17b' or at least a corrected bit into the memory. Writing back of an entire bit sequence 17b' or merely parts (bits) thereof may be the same or comparable for the first bit sequence 17'a and the second bit sequence 17'b.

If the first bit sequence 17a or the second bit sequence 17b in an error-free case is a code word of a t-bit-error-correcting code with t≥2 or a part of the code word and the code reserve is used, the error state of the first or second bit sequence can also be expressed by saying that the error state exists if there is at least a number of a bit errors in the first or second bit sequence. Here it may apply that σ>τ. τ may be an error threshold value with a value of τ≥1. If the error state does not exist, the memory controller may be designed not to write back the corrected bit sequence.

Figure 3:
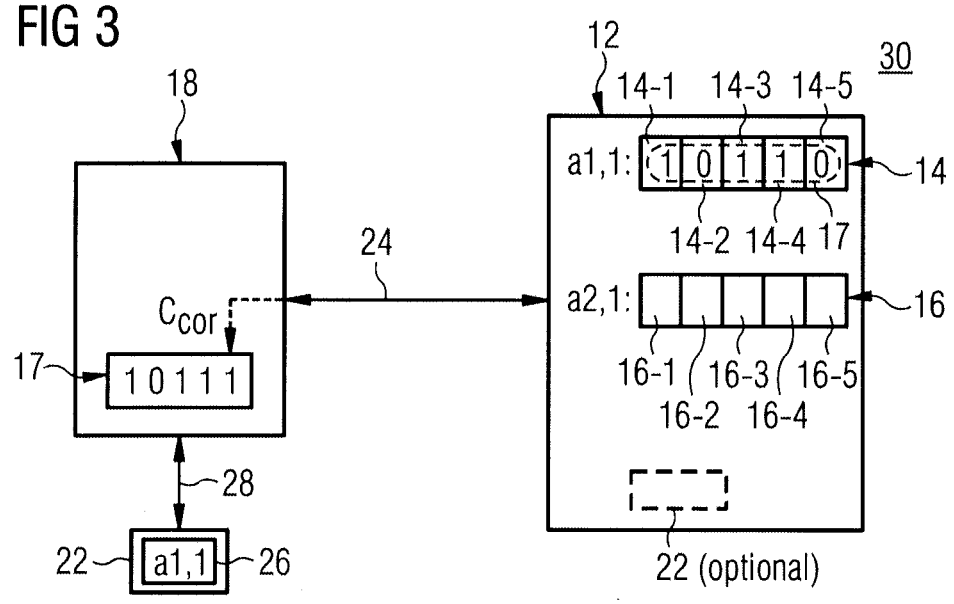
FIG. 3 shows a schematic block diagram of a further memory device according to an example embodiment.

FIG. 3 shows a schematic block diagram of a memory device 30 according to an example embodiment that modifies the memory device 10. The memory device 30 comprises the memory 12, which is formed as an addressable memory. The addressable memory 12 has first memory cells 14-1 to 14-5 or 14, which are addressed by a first address a1,1. The addressable memory has second memory cells 16-1 to 16-5 or 16, which are addressed by a second address a2,1. The second address a2,1 may be different from the first address a1,1. The bit sequences stored under the first address a1,1 and the second address a2,1 may in the error-free case be respectively bits of a code word of an error-correcting code $C_{cor}$. An erroneous bit sequence 17 may have at least one bit error. A corrected bit sequence 17' may have a number of errors that is reduced in comparison with the bit sequence 17, possibly no errors.

According to example embodiments, the bit sequences represent a segment of the code word. According to further example embodiments, the bit sequences represent the code word.

The memory device 30 comprises the memory controller 18, which is designed to provide for a correction of erroneous contents in the stored bit sequences by reading out the first and/or second memory cells 14 and/or 16 in order to carry out a reading-out operation. A frequency of successive operations of reading out the first memory cells 14 and the second memory cells 16 may be different if the reliability information 22 is available for the first memory cells 14 and/or the second memory cells 16. The reliability information may be based on an ascertained probability of an occurrence of an erroneous bit sequence in the first memory cells 14 and/or in the second memory cells 16.

The reliability information 22 may be interpreted as meaning that memory cells for which or for the address of which the reliability information is available have a higher or lower reliability (i.e. a lower probability of errors) when they are compared with other memory cells (of the same type or arranged in the same memory).

For example, the memory controller 18 is connected to the addressable memory 12 by a data line 24. The data line 24 may for example be a bidirectional data connection. Alternatively, the data line 24 may also comprise at least two unidirectional connections, for example a first connection from the memory controller 18 to the addressable memory 12 and a second connection from the addressable memory 12 to the memory controller 18. The data line 24 may be of a wire-bound or wireless configuration.

The addressable memory may be any memory in the case of which at least one memory cell can be accessed with a read access and/or a write access by using an address. For example, here it may be volatile or nonvolatile memories explained above. In particular, the memory 12 may be an MRAM memory.

For a correction of erroneous contents in the stored bit sequences of the first memory cells 14 and/or the second memory cells 16, the memory controller 18 may be designed to read out the bit sequences stored in the memory cells 14 and 16 by way of the data line 24 by using the respective address a1,1 and/or a2,1 and to check or determine a presence of an error by using the code $C_{cor}$.

The memory controller may be designed to read out more frequently the memory cells 14 and/or 16 for which the reliability information indicates that a higher error probability is assumed. The memory controller may alternatively be designed to read out less frequently the memory cells 14 and/or 16 for which a lower error probability is assumed. A proportion of memory cells with a higher error probability may be smaller than a proportion of memory cells with a lower error probability, so that an assignment of the reliability information to the memory cells with the higher error probability can take place with less effort and greater efficiency. The reliability information 22 may consequently also be referred to as error probability information.

The memory controller 18 may be designed to check the first memory cells 14 more frequently for a presence of a bit error in bit sequences stored therein. For this, the memory controller 18 may for example have the reliability information for the address a1,1. The reliability information may be for example the address a1,1 or an item of information (bit sequence) derived from it. The reliability information 22 may have an item of information concerning addresses a1,1 and/or a2,1 which refer to memory cells 14 or 16 that have a reliability different from other memory cells 16 or 14. Expressed in simplified terms, the reliability information 22 may provide an item of information concerning whether memory cells 14 or 16 are checked or are to be checked for the presence of an error more frequently than other memory cells or less frequently than other memory cells.

The reliability information may be stored in a memory 26. The memory 26 may be a volatile or nonvolatile memory, which is connected to the memory controller 18 by means of a data line 28. Alternatively or in addition, the memory 26 may be part of the memory controller 18. Alternatively or in addition, the reliability information 22 may be stored in the addressable memory 12.

The reliability information may have at least one first value, which specifies that the memory cell(s) is/are considered to be in order, and a second value, which specifies that the memory cell(s) is/are considered to be not in order. Further items of reliability information may for example indicate that a subgroup of addresses of the first of second value within the group "in order" or "not in order" is checked with a higher or lower interval.

Although the explanations that follow relate to the reliability information providing information concerning memory cells having an increased probability of having a bit error, the memory controller 18 being designed to check these memory cells 14 for the presence of an error more frequently in comparison with other memory cells 16, this may also be changed around. Thus, the reliability information 22 may for example provide information concerning the memory cells 16 having a lower probability of the presence of a bit error, so that the memory cells 16 are checked for the presence of bit errors with a lower frequency when this is compared with a frequency with which the first memory cells 14 are checked for the presence of bit errors.

The frequency of successive reading-out operations may also be understood as meaning reading-out operations at successive points in time.

The reliability information 22 is based for example on an ascertained (estimated) probability of an occurrence of an erroneous bit sequence 17. If, for example, at least one memory cell 14-1 to 14-5 of the first memory cells 14 has an increased probability of having a bit error within a time interval t+Δt, this may be generalized or aggregated for the first memory cells 14 and combined in the address a1,1 or items of information derived therefrom. As explained in detail below, the ascertained (estimated) probability of an occurrence of a bit error can be ascertained, i.e. determined or estimated, on the basis of a physical parameter of the memory cells 14. For example, a reading current may be used for reading a memory cell and/or a writing current may be used for writing a memory cell in order to estimate or determine the ascertained probability. Alternatively or in addition, the physical parameter may be a further parameter that is correlated with the thermal stability and/or be influenced by a thermal stability of the memory cells.

The memory controller may be designed to correct an erroneous bit sequence 17 that is stored under the first address a1,1 and/or the second address a2,1, and read out, by using the error-correcting code. For example, the memory controller 18 may be designed to correct the erroneous bit sequence 17 in order to obtain the corrected bit sequence 17' and in order to overwrite the memory cells 14-1 to 14-5 or 16-1 to 16-5 with the corrected bit sequence 17', so that the corrected bit sequence 17' is present in the addressable memory 12.

Although some of the example embodiments described herein are described such that the reliability information 22 is available for memory cells for which a lower or higher error probability is determined or estimated, the reliability information may also be available such that it is indicated for a first subset of addresses of the addressable memory that they have a first error probability and it is indicated for a second subset of addresses that they have a second error probability that is changed in comparison with the first subset. Alternatively or in addition, at least one further item of reliability information may indicate that a further subset of addresses addresses memory states for which a third error probability is assumed. Use of further items of reliability information makes it possible for memory cells to be read out/checked with different time intervals.

The frequency of the operations of reading out the first memory cells may be higher than the frequency of the operations of reading out the second memory cells if the reliability information (error probability information) is available for the first memory cells. The reliability information may be based on a probability of the occurrence of an erroneous bit sequence 17 in the first memory cells 14 that is increased in comparison with a reference state.

Expressed in simplified terms, the memory device 18 may be designed to check first memory cells, which have a higher probability of the occurrence of an erroneous bit sequence 17, more frequently, i.e. in smaller time intervals, than other memory cells 16. This may also be understood as meaning that, for memory cells 16 for which checking with a lower frequency is sufficient, checking is carried out with the lower frequency. This makes it possible to save computing operations, and consequently time and electrical energy, by dispensing with some checks of memory cells.

In known concepts, a periodic overwriting of cells takes place so often or in such short periods that the memory cells with the lowest thermal stability or reliability are corrected sufficiently often. This may have the effect that, although they are erroneous much less frequently, the memory cells with a great thermal stability are read out similarly often as the memory cells with a lower thermal stability, which are erroneous much more often, which leads to a high level of expenditure in terms of time and electrical power. According to example embodiments, this expenditure is reduced by for example memory cells with a great thermal stability being read out less frequently than memory cells with a low thermal stability.

For better understanding, the following explanations relate to error-correcting and/or error-identifying codes that can be used to identify or correct 1, 2, 3 or more errors. However, the example embodiments described herein are not limited by the capabilities of the code to identify errors or correct errors. For example, error-correcting codes may be designed to correct at least one and at most 100 errors, to correct at least two and at most 90 errors and/or to correct at least three and at most 80 errors.

Figure 4A:
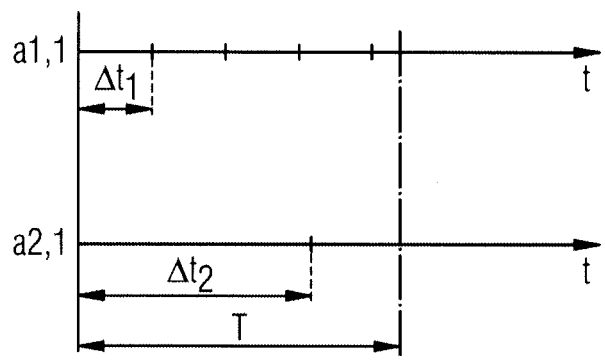
FIG. 4a shows a first schematic variation over time for a reading out and/or an overwriting of memory cells, according to an example embodiment.
Figure 4B:
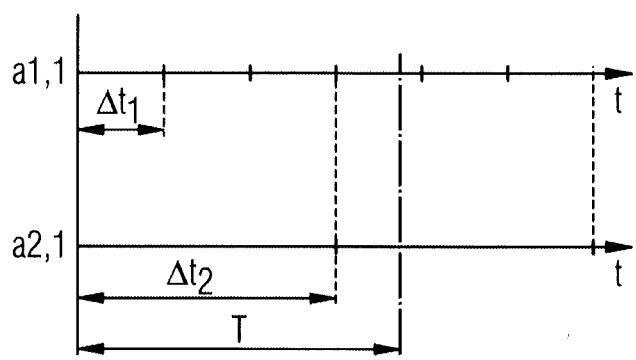
FIG. 4b shows a second schematic variation over time for a reading out and/or an overwriting of memory cells, according to an example embodiment.

FIGS. 4a and 4b shows schematic variations over time for reading out and/or overwriting memory cells on the basis of the reliability information 22. For example, the reliability information is available for the memory cells that are addressed by the address a1,1. A time interval $\Delta t_2$, with which the bit sequence under the address a2,1 is read out, may be greater than a time interval $\Delta t_1$, with which the bit sequence under the address a1,1 is read out. A frequency with which the bit sequence under the address a2,1 is read out may be less than a frequency with which the bit sequence under the address a1,1 is read out. The frequencies may be understood for example as a number of reading-out operations within the time interval T.

As schematically represented in FIG. 4b, the time interval $\Delta t_2$ may be a multiple, possibly an integral multiple, of the time interval $\Delta t_1$. For example, the memory controller may be designed to start a reading-out procedure with the time interval $\Delta t_1$ and to check whether the reliability information is available for one or more addresses.

The memory controller 18 may be designed to read out with the time interval $\Delta t_1$ the addresses for which the reliability information is available and not to read out addresses for which the reliability information is not available. The memory device 18 may be designed to read out all of the addresses a1,1 and a2,1 with the time interval $\Delta t_2$, irrespective of whether the reliability information is available. This may also be implementable in a complementary manner, for instance if the reliability information indicates that an address (address a2,1) has a lower probability of the occurrence of an error. For example, the memory device may be designed to read out with the time interval $\Delta t_1$ all of the addresses for which the reliability information is not available.

Figure 5:
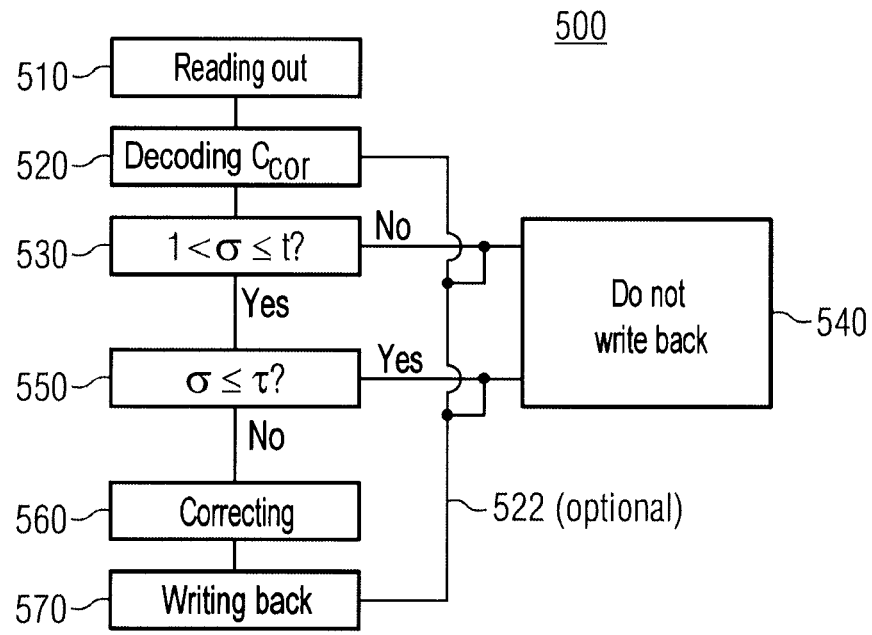
FIG. 5 shows a schematic flow diagram of a method, as can be implemented for example by a memory controller, according to an example embodiment.

FIG. 5 shows a schematic flow diagram of a method 500, as can be implemented for example by the memory controller 18. In a step 510, a bit sequence can be read out from the addressable memory. The bit sequence may for example be stored under the first address a1,1 and/or under the second address a2,1, i.e. be addressable by this address.

In a step 520, the designated bit sequence can be decoded. For this, the error correcting code $C_{cor}$ may be used by the memory controller. The error-correcting code $C_{cor}$ may be for example a t-bit-correcting code. For example, it may be that t≥1. According to further example embodiments, t≥2, which means that there are at least two bit errors in the read-out bit sequence that are correctable. According to example embodiments, it may be that t≥3, t≥4 or t≥5 or higher.

In a step 530, the error correction may be ended on the basis of an existing number σ of bit errors (step 540), for instance if the number σ is less than 1 (there is no error) or greater than t.

If the condition of the step 530 is satisfied, the memory controller may be designed to determine in a step 550 whether the number σ is less than a threshold value τ or equal to the threshold value. For the threshold value τ, it may for example be that τ≥1 and τ≤t. If a condition σ≤τ is satisfied, i.e. the number σ of errors is less than the threshold value τ or equal to the threshold value, it is possible to change over to the step 540. This may also be understood as meaning that the condition 550 provides a statement concerning whether the existing number σ of errors exhausts the number of errors that are correctable by the error-correcting code $C_{cor}$ completely or to a certain degree (threshold value) and/or whether there is a code reserve. If the number of correctable errors is not sufficiently exhausted, it is possible to dispense with writing back.

If the condition of the step 550 is satisfied for example, i.e. the number σ of errors has exceeded the threshold value τ, the memory controller may be designed to correct the bit errors in a step 560 in order to obtain a corrected bit sequence, for example the corrected bit sequence 17'.

The memory controller may be designed to write back the corrected bit sequence into the addressable memory in a step 570. This means that the memory controller may be designed to overwrite erroneous bits in an erroneous bit sequence with corrected bits and not to overwrite error-free bits. An advantage of this is that it is possible to dispense with a correction of errors if a number of existing errors is so low that the correcting code can also still correct further errors occurring. For example, an occurrence of a further error may be so improbable that a single error occurring would be constantly corrected and at least one further error is correctable by means of the code. It is then possible to dispense with a correction and/or writing back into the memory, which improves the memory device further in its efficiency.

As explained below, the writing back may be implemented in the step 570 such that the entire bit sequence is written back into the addressed memory cells. Alternatively, it is also possible that only the bits (memory cells) that have a bit error are newly written. This means that a number of written memory cells may be low or reduced, which leads to a further increase in efficiency.

The steps described above can be implemented in the order described. Alternatively, an order may also be obtained differently and/or some steps may or may not be implemented. For example, the step 560 may be implemented before the step 530. Alternatively or in addition, the step 560 may also be implemented before the step 550. Alternatively or in addition, the step 530 may for example be implemented implicitly, for instance in that, in a determination as to whether an error exists, the condition of the step 550 is checked and an explicit implementation of the step 530 is dispensed with.

Expressed in simplified terms, the memory device may be designed to correct an erroneous bit sequence stored under the first address a1,1, and read out, that has a number of σ errors by using the error-correcting code and to overwrite the erroneous bit sequence with a corrected bit sequence and/or to write back the corrected bit sequence. The error-correcting code may be a t-bit-correcting code with t≥2. It may be that 1<σ≤t. Alternatively, the memory controller may be designed to correct the read-out bit sequence if at least one error is identified and/or to overwrite the erroneous bit sequence with a corrected bit sequence and/or to write back the corrected bit sequence.

The memory controller may be designed not to overwrite the corrected bit sequence with a corrected bit sequence and not to write back the corrected bit sequence if the number of σ errors is less than or equal to a threshold value τ, where it may be that 1≤τ≤t and σ≤τ if no writing back takes place. If a corrected bit is written back, it may be that 1≤τ<σ≤t.

The memory controller may be designed to overwrite the first memory cells with the corrected bit sequence in the case of successive reading-out operations in which the first memory cells under the address a1,1 are read and in which an error in the read-out bit sequence is corrected by the code $C_{cor}$. The memory controller may be designed not to overwrite the first memory cells with a bit sequence in the case of reading operations in which the first memory cells under the address a1,1 are read and in which no error in the read-out bit sequence is corrected by the code. For example, this may take place by the condition of the step 530 not being satisfied and/or by the condition in the step 550 being satisfied.

As indicated by the optional line 522, the memory controller or the memory device may be designed to overwrite the first memory cells with the read-out bit sequence in the case of successive reading-out operations in which the first memory cells under the address a1,1 are read and in which no error in the read-out bit sequence is corrected or identified by the code. This means that the read-out memory cells may be overwritten with the error-free bit sequence even in the absence of errors or when a correction is not implemented (i.e. errors have been identified but not corrected).

The ascertained probability of an occurrence of an erroneous bit sequence in the first memory cells and/or the second memory cells on which the reliability information is based may relate to an error-free bit sequence stored in the first memory cells under the first address a1,1 at a point in time t being erroneous at a point in time t+Δt. The ascertained probability of an occurrence of an erroneous bit sequence may be ascertained by using a value of at least one physical parameter.

The physical parameter may be for example a reading current for reading a first or second memory cell, a writing current for writing a first or second memory cell and/or generally a physical parameter that is correlated with the thermal stability of a memory cell.

Figure 6:
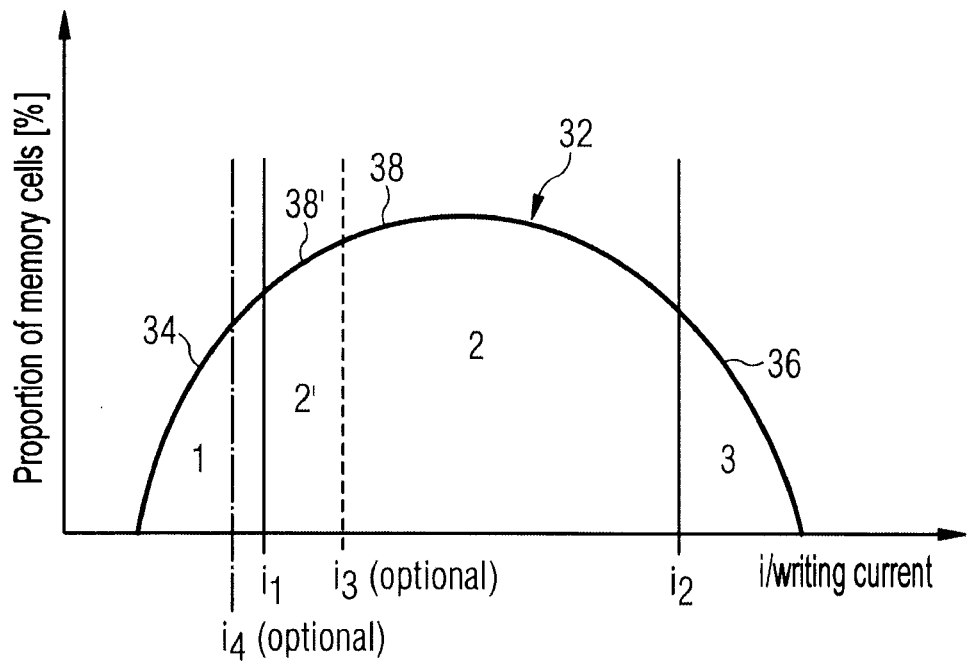
FIG. 6 shows a schematic diagram with a distribution of memory cells according to an example embodiment.

FIG. 6 shows a schematic diagram in which a writing current of memory cells of an addressable memory is represented on the x axis and a proportion of the respective memory cells that have the writing current given on the x axis is represented on the y axis. A total set 32 of the memory cells has by way of example the distribution represented. A first proportion (subset) 34 of the total set 32 of memory cells has a writing current i, which is less than a first threshold value $i_1$. A second proportion (subset) 36 of the total set 32 has a writing current i, which is greater than a second threshold value $i_2$, the second threshold value being greater than the first threshold value. A third proportion (subset) 38 of the total set 32 has a writing current which is greater than or equal to the first threshold value $i_1$ and less than or equal to the second threshold value $i_2$. A range between the threshold values $i_1$ and $i_2$ may be regarded as a reference state. Alternatively, a mean value of the threshold values $i_1$ and $i_2$ and/or the mean value with allowance for a tolerance range may also be regarded as a reference value. The tolerance range may for example be arranged in a range of ±50%, ±40% or ±30% around the mean value.

A frequency of the operations of reading out the first memory cells may be higher than a frequency of the operations of reading out the second memory cells if the reliability information is available for the first memory cells. Alternatively, the reliability information may be available for the second memory cells. The reliability information may be based on a probability P of the occurrence of an erroneous bit sequence in the first memory cells that is increased in comparison with a reference state.

If the total set 32 relates for example to memory cells of an MRAM memory, a memory cell of the subset 34 may have a higher probability of having an error in a time interval t+Δt than memory cells of the subset 38. Memory cells of the subset 36 may for example be classified as permanently erroneous. The threshold value $i_1$ may for example lie in a range of at least 10 μA and at most 40 μA, of at least 15 μA and at most 30 μA or of approximately 20 μA. The threshold value $i_2$ may for example have a value of at least 100 μA and at most 300 µA, of at least 150 µA and at most 300 µA or of approximately 200 µA. In a similar way, other physical parameters with a probability that a memory cell has an error within a time interval may be usable. For other types of memories or other types of physical parameters, other values may be usable.

The memory device or the memory controller may be designed to determine the physical parameter. Alternatively or in addition, the memory controller may be designed to obtain the physical parameter or an item of information derived from it, possibly from outside. For example, the memory controller may be designed to determine, i.e. to measure, a current for reading a memory cell and/or a current for writing a memory cell. This makes it possible that the memory device determines one or more first addresses during operation of the memory device. Alternatively, as explained in conjunction with FIG. 3, the memory controller may also be provided with the reliability information, for instance in that the reliability information is stored in the addressable memory or in a further memory.

The memory controller may be designed to compare the physical parameter with further threshold values, for example the threshold value $i_3$, which is greater than the threshold value $i_1$ and less than the threshold value $i_2$. This means that the addressable memory has third memory cells 38', which may be addressable by a third address a3,1. The bit sequence stored under the address a3,1 may in the error-free case comprise bits of a code word of the error-correcting code. The memory controller may be designed to provide for a correction of erroneous contents in the stored bit sequences by reading out the first, second and/or third memory cells in order to carry out the reading-out operation. A frequency of successive operations of reading out the first memory cells, the second memory cells and the third memory cells may be different if a first item of reliability information is available for the first memory cells and a third item of reliability information is available for the third memory cells. The first reliability information and the second reliability information may be based on an ascertained probability of an occurrence of an erroneous bit sequence in the first, the second and/or the third memory cells. This means that further subsets of addresses may be stored or ascertained or that the addresses of the addressable memory may be read out in more than two frequencies that are different from one another. This may also be understood as meaning that the memory controller may be designed to check the second bit sequence, which is stored in the second memory cells, with a frequency assigned to the second memory cells and to check a bit sequence stored in the third memory cells 38' with a frequency assigned to the third memory cells. The frequency assigned to the first memory cells, the frequency assigned to the second memory cells and the frequency assigned to the third memory cells may be different on the basis of the reliability information and/or on the basis of the physical parameter for the first memory cells, on the basis of the reliability information and/or on the basis of the physical parameter for the second memory cells and on the basis of the reliability information and/or on the basis of the physical parameter for the third memory cells.

Alternatively or in addition, the memory controller may be designed according to a further example embodiment to perform a subdivision of the subset 34 on the basis of a threshold value $i_4$. This means that different memory cells classified as susceptible to errors may be assigned frequencies that are different from one another, for instance on the basis of items of partial reliability information that are different from one another. The memory controller may be designed to check these memory cells with the frequencies that are different from one another on the basis of the reliability information comprising the items of partial reliability information. For example, the items of partial reliability information may be stored as addresses or information derived therefrom in memories or memory areas that are different from one another, which are interrogated at different intervals.

In other words, FIG. 6 shows an example of a proportion of memory cells, for example of an MRAM, in dependence on the values of the writing current i or an illustration of percentage proportions of memory cells with different writing currents. The proportion of memory cells that require a writing current i with $i<i_1$ is represented by the area marked by 1. In this case, $i_1$ may for example be a value of about 20 microamperes and $i_2$ a value of 200 microamperes. The proportion of the memory cells that have a writing current i with $i_1<i \leq i_2$ is represented by the area marked by 2. The proportion of the memory cells that have a writing current i with $i>i_2$ is represented by the area marked by 3.

It may for example be assumed that memory cells with a writing current less than $i_1$ have a greater probability that they are in an erroneous state at a point in time $t_+\Delta t$ if they were in a correct state at the point in time t than memory cells that have a writing current i with $i_1<i \leq i_2$. Memory cells with a writing current i with $i>i_2$ may be assumed with a relatively great probability to be permanently erroneous.

Addresses which address at least one memory cell that has a writing current i with $i>i_2$ may in the case of an error being present be chosen as addresses that are repaired by a repair process.

If memory cells are addressed by an address α, so that at least one of these memory cells has a permanent error, it is possible if in such a cell the current value to be stored deviates from the permanent value to store an inverted bit sequence or to store a bit sequence inverted in a group of bits and to mark by at least one inversion bit whether the stored bit sequence or group of bits is stored inverted or not inverted.

If a t-bit-error-correcting code with for example t=2 is used as the error-correcting code $C_{cor}$, the set of addresses α1 may be determined as the addresses which address memory cells that have two memory cells with a writing current less than or equal to $i_1$. The set of addresses that have two memory cells with a writing current less than or equal to $i_1$ is smaller than the set of addresses that have one memory cell with a writing current less than or equal to $i_1$.

If a t-bit-error-correcting code with t≥3 is used, the set of addresses α1 can then be determined as the addresses which address the memory cells that have τ memory cells with a writing current less than or equal to $i_1$, where τ≤3.

The addresses which address more than τ memory cells with a writing current less than or equal to $i_1$ may also be chosen as addresses that are repaired. Example embodiments envisage modifying the various sets of addresses while operation is in progress.

Other example embodiments envisage determining the various sets of addresses at the start-up and then modifying them while operation is in progress.

It is thus possible for example to assign an address a, which initially does not belong to α1, to the set α1 when a τ-bit error has occurred under this address, if a t-bit-error-correcting code is used for the error correction and 1≤τ≤t with t≥1.

Other example embodiments envisage removing an address a1,j of the set α1 from this set if in S accesses to this address no error has occurred and S is a number of accesses to be prescribed.

Other example embodiments envisage keeping a table while operation is in progress or in the start-up mode of how often memory cells have become erroneous in the case of a memory access and modifying the sets α1 or α2 on the basis of the data stored in the table.

It is also possible to consider more than two threshold values for the writing current and to form more than two subsets of addresses.

Other example embodiments envisage determining the proportion of memory cells with a reading current i and predicting or estimating in dependence on the value of the reading current for a memory cell the probability that an error-free value stored in a memory cell at the point in time t is erroneous at a point in time t+Δt and determining the set α1 of addresses in dependence on the required reading current.

Other example embodiments envisage predicting or estimating in dependence both on the measured writing current and on the reading current for a memory cell the probability that an error-free value stored in the memory cell at the point in time t is erroneous at a point in time t+Δt and determining the set α1 of addresses that are read out more frequently in dependence both on the writing current and the reading current, the read-out data being corrected and written back in the event of a correctable error.

Reference is made below to memory cells that are addressable by an address in the addressable memory.

FIG. 7 shows a schematic diagram with an assignment of memory cells to addresses of the memory 12. An address of the addressable memory may for example be resolvable by a number of l bits, so that on the basis of the l bits a number of $2^l$ addresses are resolvable, i.e. addressable, in a range from 0 to $2^l-1$. Under a plurality, multiplicity or possibly all of the addresses a, a number of c check bits and a number of u data bits can be stored. A code word 42 of the code $C_{cor}$ to be corrected may comprise the check bits c and the data bits u. Alternatively or in addition, a code word 42' may comprise the check bits c, the data bits u and address bits or bit sequences derived from them. The superscripted indices 0 to $2^l-1$ of the address bits a, the check bits c and the data bits u may serve for illustrating under which of the addresses 0 to $2^l-1$ the respective bits can be stored.

An advantage of the code word 42' is that the stored address information of the first and/or second addresses a1,1 and/or a1,2 is also codable and consequently correctable. This means that a bit error in an item of stored address information is identifiable and/or correctable.

Alternatively, the code word 42' may also comprise another item of information derived from the address bits a, for instance comprising a redundant item of information with respect to the address bits.

Example embodiments described below relate to the addressable memory, the first address a1,1 and the second address a2,1 being considered more closely for example. According to example embodiments, the addressable memory has a multiplicity of addresses, which are respectively designed to address memory cells, items of information which are part of a code word of the error-correcting code or which are the code word being storable in the respective memory cells.

Descriptions given above with respect to the first and second addresses may be understood such that, according to example embodiments, the addressable memory may have a multiplicity of further first addresses a1,2, . . . a1,m with m>1. In addition, the addressable memory may have further second memory cells, which are addressable by further second addresses a2,2, . . . , a2,M with M>1. The first memory cell and the further first memory cells may form a total set of first memory cells, for instance the subset 34.

The above explanations with respect to the first memory cells can be readily transferred to the further first memory cells. The total set of first memory cells may be addressable by a first subset of addresses α1, it being possible for the subset α1 to comprise the addresses a1,1, . . . a1,m with m≥1. The second memory cell and the further memory cells (for instance the memory cells which are addressable by the address a2,2 . . . a2,M) form for example a total set of second memory cells, for instance the subset 38 or the total set 32. The above explanations with respect to the second memory cells can be readily transferred to the further second memory cells. The total set of second memory cells may be addressable by a second subset of addresses α2, it being possible for α2 to comprise the addresses a2,1, . . . , a2,M with M≥1. The addresses α2 may also be all of the used addresses of the memory and/or comprise the addresses α1.

The first and second addresses or the first subset α1 and second subset α2 of addresses may be respectively stored in a memory. Alternatively, the first subset α1 of addresses or the second subset α2 of addresses may for example be stored in an address memory, while the other subset may for example relate to all of the addressable or used addresses and implicitly be known. This subset may for example also be addressable without storing the same in a memory, for instance by an address counter, which is designed to increment or decrement an item of address information, so that all of the addresses are run through cyclically. The memory controller may be designed to compare the respective value of the address counter with a content of the memory 26. Expressed in simplified terms, a subset or the total set of addresses may comprise the other subset of addresses.

The memory controller may be designed to provide for a correction of erroneous contents in stored bit sequences 44a and/or 44b by reading out the total set of first and/or second memory cells 14a-b or 16a-b in order to carry out a reading-out operation. The frequency of successive operations of reading out the total set of first memory cells 14a-b and the total set of second memory cells 16a-b may be different if the reliability information is available for the total set of first memory cells 14a-b and/or for the total set of second memory cells 16a-b. With reference to FIG. 3, the reliability information 22 may for example comprise or refer to the address a1,1 and the address a1,2.

The frequency of the operations of reading out the total set of first memory cells 14a-b may be higher than the frequency of the operations of reading out the total set of second memory cells 16a-b if the reliability information is available for the total set of first memory cells 14a-b.

With reference to FIG. 3, the memory device 10 may be designed to determine the subset α1 during a start-up of the memory device 10. The start-up may for example relate to an initial operating procedure, a booting operation and/or a cyclical checking operation of the device. For example, the memory controller 18 may be designed to record the physical parameter of a respective memory cell and/or a group of memory cells and to determine the first subset α1 and/or the second subset α2 on the basis of the recorded physical parameter. Alternatively, the first or second subset may be determined and stored by another device, for instance during a production process.

The memory controller 18 may be designed to store the specific first subset α1 and/or the second subset α2 in a volatile memory. Alternatively or in addition, the memory controller may be designed to store the first subset α1 and/or the second subset α2 in a nonvolatile memory and/or in the addressable memory 12. Storing the first or second subset in the addressable memory 12 may make it possible for the addressable memory 12 already to contain items of information as to which memory cells require more frequent or less frequent checking. Storing the first subset α1 and/or the second subset α2 in a nonvolatile memory, for instance in the memory 26 or a local memory of the memory device 18, may make quick access to the reliability information and/or address information possible. Furthermore, storing the first subset α1 and/or the second subset α2 in a memory that is different from the addressable memory 12 may make it possible that the stored information is independent with respect to the subsets of an error probability of the addressable memory 12.

In other words, FIG. 7 shows an addressable memory with I-dimensional addresses, which can store n bits under each address. In the addressable memory there may be stored check bits and data bits of an error-correcting code. There are for example $2^I$ addresses, which can be written in binary notation as $$a^0 = (a_0^0, \ldots, a_{I-1}^0) = \underbrace{(0, \ldots, 0)}_{I}, a^1 = (a_0^1, \ldots, a_{I-1}^1) = \underbrace{(0, \ldots, 0, 1)}_{I},$$

$$\ldots, a^{2^I-1} = (a_0^{2^I-1}, \ldots, a_{I-1}^{2^I-1}) = \underbrace{(1, \ldots, 1)}_{I}.$$

The bits stored under the address $a^i$ are denoted as $x^i = x_0^i, \ldots x_{n-1}^i$.

In the example embodiment under consideration, the bits $x^i$ consist of m check bits $c^i = c_0^i, \ldots, c_{m-1}^i$ and k useful data bits $u^i = u_0^i, \ldots, u_{k-1}^i$ or data bits $u^i = u_0^i, \ldots, u_{k-1}^i$ where n=m+k and $$x^i = c^i, u^i = c_0^i, \ldots, c_{m-1}^i, u_0^i, \ldots, u_{k-1}^i$$

For i=0, ..., $2^I-1$, the check bits $c^i$ and the useful data bits $u^i$ in the error-free case are bits of a code word of an error-identifying/error-correcting code $C_{cor}$, such as that explained in more detail below. The useful data bits may also be referred to simply as data bits.

FIG. 8 shows a schematic representation of bit sequences stored under the addresses. In other words, FIG. 8 illustrates an example embodiment of an addressable memory in which for example code words of an error-correcting code are stored. For example, l=3, m=5 and k=7 are chosen.

Under 8 addresses $a^0$=[0,0,0], $a^1$=[0,0,1], ..., $a^7$=[1,1,1], 5 check bits $c_0, c_1, c_2, c_3, c_4$ and 7 data bits $u_0, \ldots, u7$ are respectively stored. The check bits $c_0, c_1, c_2, c_3, c_4$ and the data bits u0, ..., u7 are in the error-free case bits of a code word of an error-identifying/error-correcting code $C_1$, which is given for example by its H-matrix $H^1$.

In the example embodiment under consideration, the bits $c_0, \ldots, c_4, u_0, \ldots, u_7$ stored in the memory under the addresses $a^0, \ldots, a^7$ are respectively code words of the code $C_1$ determined by the H-matrix $H^1$, so that for example $$H^1 \cdot (c_0, \ldots, c_4, u_0, \ldots, u_T)^T = \underbrace{0, 0, \ldots, 0}_{5}. \quad (1)$$

The H-matrix $H^1$ in its systematic form is $$H^1 = \begin{pmatrix} 1 & 0 & 0 & 0 & 0 & 1 & 1 & 1 & 1 & 1 & 1 & 0 \\ 0 & 1 & 0 & 0 & 0 & 1 & 1 & 1 & 0 & 0 & 0 & 1 \\ 0 & 0 & 1 & 0 & 0 & 1 & 0 & 0 & 1 & 1 & 0 & 1 \\ 0 & 0 & 0 & 1 & 0 & 0 & 1 & 0 & 1 & 0 & 1 & 1 \\ 0 & 0 & 0 & 0 & 1 & 0 & 0 & 1 & 0 & 1 & 1 & 0 \end{pmatrix} \quad (2)$$

from which the equations $$c_0 = u_0 + u_1 + u_2 + u_3 + u_4 + u_5$$

$$c_1 = u_0 + u_1 + u_2 + u_6$$

$$c_2 = u_0 + u_3 + u_4 + u_6$$

$$c_3 = u_1 + u_3 + u_5 + u_6$$

$$c_4 = u_2 + u_4 + u_5$$

are obtained for the check bits $c_0, \ldots, c_4$ by multiplying out equation (1). When linking binary values, here and hereinafter the operation "+" means modulo-2 addition, which as a logical XOR operation can be realized by XOR gates.

The code $C_1$ is for example a Hsiao code, which allows 1-bit errors to be corrected and 2-bit errors to be identified. All of the columns of H-matrix $H^1$ have for example an uneven number of ones, and they are different in pairs.

A code word disturbed by an error is denoted by $$[c^i, u^i]' = c_0^{i'}, \ldots, c_4^{i'}, u_0^{i'}, \ldots, c_6^{i'}.$$

The componentwise XOR sum of an error-free code word $c^i, u^i$ and of the code word $[c^i, u^i]'$ disturbed by errors originating from this code word is denoted for example as error vector $e^i$, so that in this example embodiment it may be that $$e^i = e_0^i, \ldots, e_{12}^i = c_0^i + c_0^{i'}, \ldots, c_4^i + c_4^{i'}, u_0^i + u_0^{i'}, \ldots, u_6^i + u_6^{i'}$$

If a component of the error vector is equal to 1, then there is an error in this component.

The error syndrome s of a vector $[c^i, u^i]'$ is determined as $$S^\tau = H^1 \cdot ([c^i, u^i]')^\tau = H^1 \cdot (e^i)^\tau \quad (3).$$

The term $s^\tau$ denotes a column vector, which has components $s_0, s_1, \ldots$, where s is a corresponding row vector. If a single component of $[c^i, u^i]$ is erroneous, then the error vector $e^i$ has precisely one one. This may be referred to as a 1-bit error. If q, q≥1 components of $[c^i, u^i]$ are erroneous, then the error vector $e^i$ has precisely q, q≥1 ones. This may be referred to as a q-bit error. In the example embodiment under consideration, the error syndrome $s=s_0, \ldots, s_4$ is equal to $$s_0 = c_0' + u_0' + u_1' + u_2' + u_3' + u_4' + u_5'$$

$$s_1 = c_1' + u_0' + u_1' + u_2' + u_6'$$

$$s_2 = c_2' + u_0' + u_3' + u_4' + u_6'$$

$$s_3 = c_3' + u_1' + u_3' + u_5' + u_6'$$

$$s_4 = c_4' + u_2' + u_4' + u_5' \quad (4)$$

In practice, the error syndrome s may be determined by a syndrome generator, which implements the equation (4) and which can be easily implemented for example by using XOR gates. For example, an available synthesis tool may be used.

For a 1-bit error, an error syndrome that is equal to one column of the H-matrix may be obtained.

If for example the 12th component $u_6$ of c,u in $u_6'=u_6+1=\bar{u}_6$ is disturbed, then an error syndrome $$s^\tau = H^1 \cdot (0, \ldots, 0, 1)^\tau = (0, 1, 1, 1, 0)^\tau$$

can be obtained, which is equal to the 12th column of the H-matrix $H^1$. For a 2-bit error, an error syndrome that is equal to the componentwise XOR sum of two corresponding columns of the H-matrix is obtained.

If for example the 12th component $u_6$ and the 11th component of c, u in $u_6'=u_6+1=\bar{u}_6$ and $u_5'=u_5+1=\bar{u}_5$ are disturbed, then an error syndrome $$s^\tau = H^1 (0, \ldots, 0, 1, 1)^T = (1, 1, 1, 0, 1)^T$$

is obtained, which is equal to the XOR operation being performed componentwise on the 12th column and the sixth column of the H-matrix $H^1$. Each 2-bit error may in this example embodiment lead to an error syndrome unequal to 0 that has an even number of ones. Each of the 12 possible 1-bit errors leads to a different error syndrome, which is equal to one of the columns of the H-matrix $H^1$ that are different in pairs, so that each 1-bit error is injectively assigned an error syndrome, so that a 1-bit error can be uniquely decoded on the basis of its error syndrome.

For example, from the useful data bits $u_0, \ldots, u_6 = 1010010$, the check bits are determined in accordance with equation (4) as $c_0, c_1, c_2, c_3, c_4 = 10110$ and in FIG. 8 the code word 101101010010 is stored under the address $a_{11} = 010$. From the useful data bits $u_0, \ldots, u_6 = 1101100$, the check bits are determined in accordance with equation (4) as $c_0, c_1, c_2, c_0, c_4 = 00101$ and in FIG. 8 the code word 001011101100 is stored under the address a2,1=101.

In the example embodiment under consideration, the address a1,1=010 is a first address and the address a2,1=101 is a second address different from the first.

At a point in time t, under the first address a1,1=010 there is stored an error-free bit sequence, here the bit sequence 101101010010, and under the second address a2,1=101 there is stored an error-free bit sequence 101101010010.

The estimated probability that at a point in time t+Δt, with Δt>0, an erroneous bit sequence is stored under the address a1,1 if at the point in time t an error-free bit sequence was stored under the address a1,1 is presumed to be greater than the estimated probability that at a point in time t+Δt an erroneous bit sequence is stored under the address a2,1 if at the point in time t an error-free bit sequence was stored under the address a2,1.

Example embodiments provide that the memory cells that are addressed by the address a2,1 are less susceptible to errors than the memory cells that are addressed by the address a1,1.

Other example embodiments provide that the memory cells that are addressed by the address a1,1 include one or more memory cells that are susceptible to errors to a greater degree than the memory cells that are addressed by the address a2,1.

It may be possible that, by measuring a physical parameter or a number of physical parameters, it can be predicted or estimated whether the probability of an error in a bit sequence stored under the address a1,1 is greater than the probability of an error in a bit sequence stored under the address a2,1. For example, the parameter may be a value or level of a writing current or the required period of time to write a value under the corresponding address.

In embodiments, the addressable memory comprises a so-called emerging memory, which describes new memories, like MRAM, RRAM (resistive RAM) or PC-RAM (phase-change memory). The addressable memory may also be implemented as such a memory. In some memories, like MRAM, the data storage of a memory cell may be defined already at the time of delivery by means of a physical parameter (level of the writing current or value of the writing current, for example). This state will then basically be maintained. The reliability information may thus relate to an original or manufacturing-related characteristic of the memory cell which is hardly or not influenced by aging effects of the memory, i.e. is not aging-related, and is inherent to memory cells checked more frequently, which represent a real sub-set of all the memory cells of the memory.

Correcting a bit sequence by overwriting one or several erroneous bits, wherein one, several or all the error-free bits of this bit sequence are excepted in the writing processes, may also be understood such that the addressable memory is a memory which can be changed bit by bit. This means that the bits can be addressed individually and read or written, or cleared and programmed individually. Other memories, like a Flash memory, only allow clearing access to bits, which are to be cleared before programming, in blocks.

By correcting or resetting (clearing and programming) individual bits, the corrected bit sequence does not have to be buffered in the same or a different non-volatile memory. It is conceivable for a reading unit, like a microprocessor, a CPU or another device, to buffer the bit sequence for further usage or processing in a volative memory. Register memories or (S)RAM memories may be used here. This is possible in order to read out or collect the data for further processing, the characteristic of the word itself not being changed here. This means that this does not correspond to an additional and redundant storage of the corrected bit sequence in the same memory or in another memory, as is done in Flash memories for example, where a corrected word is written to a new memory address and consequently is present in the memory in a corrected form and a non-corrected form. Expressed in a simplified manner, the memory controller may be configured to correct an erroneous bit sequence in the memory without any redundancy in the memory. Other memories, like Flash memories, only allow clearing access to bits in blocks, the bits having been cleared before programming in blocks, By correcting individual bits, the "date", that is characteristics of the bit sequence, like original datum or set-up date, in the memory may remain unchanged. Alternatively or additionally, the address of the bit sequence in the memory may also remain unchanged. Expressed in a simplified manner, the correction takes place at the same address without moving the bit sequence in the non-volatile memory or from the non-volatile memory, i.e. free from moving.

Thus, embodiments provide for a corrected bit sequence to be overwritten, i.e. writing takes place to the original address. This may include for one, several or all the error-free bits not to be written. Alternatively or additionally, this may include for the correction to take place in a non-volatile memory without buffering.

Over a passage of time, the values stored in memory cells may change erroneously. For example, in flash memories states may be stored as electrical charges that may decrease over time. If they become less then a certain threshold value, the losses in charge may have the effect of an error. Here, the state of the memory cell is a continuous value. In order to counteract the losses of charge described, the stored values may be read out before the analog state values fall below a threshold value and the read-out digitally converted values may be re-written into the same memory cells or into other memory cells as analog states, which for memory cells with analog state values may be referred to as refreshing. Refreshing allows an analog state of a memory cell that is already close to the threshold value to be changed such that it is far away from the corresponding threshold value again.

As a difference from this, in an MRAM the stored states are digital variables. It is possible in an MRAM that the digital states change for example due to quantum effects into erroneous digital states of the memory cells. It is also possible that, in a number of memory cells that are addressed by one address, over time there form erroneous digital states, which have the effect of multibit errors. Example embodiments provide that such multibit errors cannot be corrected with an error-correcting code that is used, which is disadvantageous.

In order to avoid an accumulation of errors that possibly cannot be corrected by an error-correcting code that is used, it may be advisable here to read out the possibly erroneous bit sequences stored under an address before multiple errors have formed, correct them by using an error-correcting code and write the corrected bit sequences back into the same memory cells under the same address.

If there is no error in a read-out bit sequence, it may not be considered necessary to write this bit sequence back, since writing back of the same digital values that are already stored in the memory cells does not change the digital states of the corresponding memory cells. Unnecessary time for the writing back of correct values and unnecessary electrical power consumption can be advantageously saved if only contents of memory cells in which erroneous bit sequences are stored are written back under the addresses.

In yet other words: an accumulation of errors in a memory of which the bits are stored digitally in memory cells can be reduced by the bit sequences that are stored in the memory cells being read out for example periodically or at certain points in time before too great a number of errors have formed, and, if there is an error, by the bit sequences only being corrected by an error-correcting code and the corrected bit sequences written back if the error can be corrected by the code under consideration. For this purpose, it is necessary that the bit sequences stored under an address are bits of an error-correcting code $C_{cor}$.

When the term "writing back" or the term "overwriting" is used here, the following situation may then be described:

Under an address a, a binary sequence of memory cells that are addressed by a is read out. If the read-out binary sequence is erroneous and the error can be corrected by the error-correcting code that is used, then the read-out binary sequence is corrected, and the corrected binary sequence is stored under an address a* in the memory. In this case it is possible that a*=a and the corrected binary sequence is stored (overwritten) under the same address under which the read-out erroneous binary sequence was stored.

If a≠a*, then the corrected binary sequence is stored (written back) under another address, for example in another memory block or in another memory. The writing back or overwriting may be realized in various ways. This means that the memory controller may be designed to replace the first and/or the second address by another address by means of a repair process.

If a=a*, then it is possible for example that the memory cells in which the erroneous binary sequence was stored are first cleared before the corrected binary sequence is written into the memory cells under the address a.

Other example embodiments provide that only the memory cells in which the erroneous bits of the erroneous binary sequence were stored are cleared, before only the corrected bits are written into these memory cells, and the other memory cells remain unchanged.

Other example embodiments provide that bits of a group of bits that contain the erroneous bits of the erroneous binary sequence are cleared, before corresponding bits of the corrected binary sequence are written into the cleared memory cells. The possibilities described are not exhaustive or definitive but serve merely for better understanding.

Example embodiments provide that, for different addresses of the memory, the probability or the estimated probability that an error-free bit sequence stored under this address at the time t is erroneous at the point in time t+Δt is different. It may be possible that these probabilities can be predicted or estimated for example on the basis of values of physical parameters when writing data into memory cells or when reading data from memory cells.

It may be sufficient in this case to determine a relatively rough estimate of this probability. It may also be sufficient to estimate under which addresses bit sequences that are error-free at a point in time t are erroneous at a point in time t+Δt with a greater probability than bit sequences stored under other addresses, without the specific values of these probabilities having to be determined.

When it is stated here for the sake of a simple description that the estimated probability that a correct bit sequence stored under an address a1,1 at the point in time t is erroneous at the point in time t+Δt is greater than the estimated probability that a correct bit sequence stored under an address a2,1 is erroneous at the point in time t+Δt, the following situations may for example be described by this:

1. The probabilities are predictable or predicted on the basis of observations or on the basis of measurements of for example physical parameters as a numerical value.
2. On the basis of observations or measurements of for example physical parameters it can predicted with justification that the estimated probability that a correct bit sequence stored under an address a1,1 at the point in time t is erroneous at the point in time t+Δt is greater than the estimated probability that a correct bit sequence stored under an address a2,1 at the point in time t is erroneous at the point in time t+Δt, without a specific value for these probabilities having to be determined.

Example embodiments envisage reading out at certain points in time or at certain time intervals for all of the addresses for example of an MRAM the bit sequences stored under these addresses, the bit sequences in the error-free case being bit sequences of an error-correcting code $C_{cor}$.

If an error that can be corrected by the code $C_{cor}$ is identified, the bit sequence can be corrected and the corrected bit sequence can be written back under the corresponding address.

For example, in the case of such a procedure all of the addresses of the MRAM may be addressed and read out and checked for errors. This may require a great expenditure of time, even though for example only a relatively small part of the bit sequences are written back, to be specific only the bit sequences that are erroneous and have been corrected. Similarly, a great expenditure in terms of electrical power is required. The great expenditure in terms of time and electrical power is disadvantageous.

In particular, it is disadvantageous that, in the case of the procedure described, the time interval or the frequency for the reading out of the memory cells is adapted to the memory cells for which the probability that a correct value stored at the point in time t is erroneous at the point in time t+Δt is the greatest.

According to example embodiments, bit sequences under the addresses that output erroneous bit sequences with a greater estimated probability than addresses that output erroneous bit sequences with a lower estimated probability are read out more frequently, the stored bit sequences in the error-free case being bits of a code word of an error-correcting code.

If an identified error in a read-out bit sequence can be corrected by the error-correcting code that is used, then it can be corrected and the corrected bit sequence can be written back, it being possible for the writing back of a corrected bit sequence to take place under the same address under which the erroneous bit sequence was read out or else under another address. Addresses that store erroneous bit sequences with greater probability are for example read out more frequently than addresses that store erroneous bit sequences with lower probability. Addresses that store erroneous bit sequences with lower probability are read out less frequently. In addition, for example for an MRAM, at the same time only the bit sequences that were read out as erroneous bit sequences and have been corrected may be written back. Consequently, the time expenditure and the expenditure of electrical power, such as for example writing current or reading current, are low, which is advantageous.

Both the relative number of addresses that store erroneous bit sequences with greater probability and the probability that read-out bit sequences are erroneous may be low. In this case, as explained, in the error-free case the bit sequences that are stored under an address are for example bits of an error-correcting code.

The addresses of the memory under consideration may in this case be divided into a first group of addresses $\alpha 1$ and a second group of addresses $\alpha 2$, so that the estimated probability that a correct bit sequence stored under an address $a1,i \in \alpha 1$ at the point in time t is erroneous at the point in time $t+\Delta t$ is greater than the estimated probability that a correct bit sequence stored under an address $a2,j \in \alpha 2$ at the point in time t is erroneous at the point in time $t+\Delta t$. The addresses of the memory may also be divided into Q groups $\alpha 1, \ldots, \alpha Q$ with $Q>2$, so that the estimated probability that a correct bit sequence stored under an address $ak,j \in \alpha k$ at the point in time t is erroneous at the point in time $t+\Delta t$ is greater than the estimated probability that a correct bit sequence stored under an address $a_r,j \in \alpha_r$ with $r>k$ and $1 \le k<r \le Q$ at the point in time t is erroneous at the point in time $t+\Delta t$. Then, according to example embodiments, the bit sequences under the addresses of the group $\alpha_k$ may be read out, and in the case of a correctable error written back, more frequently than under the addresses of the group $\alpha_r$.

A t-bit-error-correcting code may be used as the error-correcting code Ccor, where $t \ge 1$. Example embodiments provide that the code is also a (t+1)-bit-error-identifying code.

If $t \ge 2$, it is then also possible to correct the bit sequences read out under an address and write them back in corrected form if there is a 2-bit error and not to write them back if there is a 1-bit error or no error.

If $t>2$, it is then also possible to correct the bit sequences read out under an address and write them back in corrected form if there is at least a τ-bit error (i.e. a number of σ errors with σ>τ) and not to write them back if there is at most a τ−1-bit error, where then for example τ<t.

If the code $C_{cor}$ is for example a 2-bit-error-correcting and 3-bit-error-identifying BCH code, then it is possible in the case of a 1-bit error not to write back an erroneous bit code read out under an address a as a corrected bit sequence, so that an erroneous bit sequence with a 1-bit error continues to be stored under the address a. Example embodiments envisage in the case of a 2-bit error writing back an erroneous bit sequence read out under an address a as a corrected bit sequence, so that after the reading out and writing back a corrected bit sequence is stored under the address a.

It is then possible that the stored bit sequences have 1-bit errors, which however are dependably corrected with the 2-bit-error-correcting code $C_{cor}$ during a reading out for the purpose of using the read-out data. Even whenever a further error occurs in a bit sequence, the 2-bit-error-correcting code still corrects correctly.

For example, 2-bit errors occur relatively infrequently (with a lower probability than 1-bit errors) in the stored bit sequences. The scale on which corrected bit sequences are written back can be reduced without the correctness of the bit sequences that are read out and corrected by using the error-correcting code $C_{cor}$ being impaired significantly. Even a very infrequent 3-bit error is for example still identified as a non-correctable error.

If a t-bit-error-correcting code with $t \ge 2$ is used, it may then be possible for the set of addresses $\alpha 1$ that are read more frequently for the purpose of correction of the stored data to be chosen to be smaller than if a code that can correct fewer than terrors is used, which may be advantageous.

If for example t=2, then it is possible, as already described, to correct and write back bit sequences if a 2-bit error has occurred and not to write them back if a 1-bit error has occurred. An address a may be assigned to the set $\alpha 1$ whenever the memory cells addressed by a include at least 2 memory cells that have a comparatively great estimated probability that their occupancy at the point in time $t+\Delta t$ is erroneous if it was correct at the point in time t. Such a probability may be estimated for example on the basis of the required writing current or the required reading current. The set $\alpha 1$ of addresses to be read more frequently may be relatively small, since two memory cells that are erroneous with a greater probability and are addressed by the same address for example occur relatively infrequently.

An address a may alternatively also be assigned to the set $\alpha 1$ if the memory cells addressed by a include 1 memory cell that has an comparatively great estimated probability that its occupancy at the point in time $t+\Delta t$ is erroneous if it was correct at the point in time t. The set $\alpha 1$ of addresses to be read more frequently can then be greater. The probability that errors can accumulate in the memory cells can however be correspondingly lower.

If the code that is used is a t-bit-error-correcting code, then the set $\alpha 1$ may be determined as follows:

1. If for example t=1, then an address a may be assigned to the set $\alpha 1$ if the address a is used to address at least one memory cell that has a comparatively great estimated probability that its occupancy at the point in time $t+\Delta t$ is erroneous if it was correct at the point in time t.
2. If for example t=2, then an address a may be assigned to the set $\alpha 1$ if the address a is used to address at least two memory cells that have a comparatively great estimated probability that their occupancy at the point in time $t+\Delta t$ is erroneous if it was correct at the point in time t.

If for example t=2, then an address a may be assigned to the set $\alpha 1$ if the address a is used to address at least one memory cell that has a comparatively great estimated probability that its occupancy at the point in time $t+\Delta t$ is erroneous if it was correct at the point in time t.

If for example t=3, then an address a may be assigned to the set $\alpha 1$ if the address a is used to address at least three memory cells that have a comparatively great estimated probability that their occupancy at the point in time t+Δt is erroneous if it was correct at the point in time t.

If for example t=3, then an address a may be assigned to the set α1 if the address a is used to address at least two memory cells that have a comparatively great estimated probability that their occupancy at the point in time t+Δt is erroneous if it was correct at the point in time t.

If for example t=3, then an address a may be assigned to the set α1 if the address a is used to address at least one memory cell that has a comparatively great estimated probability that its occupancy at the point in time t+Δt is erroneous if it was correct at the point in time t.

The code may have greater values for t. An address may for example belong to or be assigned to the set α1 if the address a is used to address at least τ memory cells that have a comparatively great estimated probability that their occupancy at the point in time t+Δt is erroneous if it was correct at the point in time t, where τ≤t. Depending on τ, there are various variants.

It is also possible that in a memory there is a set αper, memory cells that are addressed under these addresses having permanent errors.

According to example embodiments, a repair mechanism is provided for these addresses. Example embodiments envisage providing a repair mechanism whenever an address is used to address more than σ memory cells that have permanent errors, where σ≤t.

However, according to example embodiments it is also possible to store inverted bit sequences for the bit sequences to be stored under such addresses, or to store bit sequences inverted on certain bit groups. Thus it is possible for example to invert a bit sequence if there is a permanent stuck-at-0 error in a memory cell and a value 1 is present at the corresponding position in the bit sequence to be stored. If the bit sequence to be stored is inverted, then there is a 0 at the corresponding position, which can be stored error-free in the memory cell with stuck-at-0.

The addressable memory may have memory cells that are addressable by a third subset αper of addresses, the memory controller being designed to store a bit sequence to be stored bitwise-inverted in memory cells that are addressed by the third subset, for instance the subset 36, of addresses. At least one memory cell that has a permanent error is addressable by an address of the third subset of addresses with an ascertained probability pper. Here it may be that pper≥SWper, where SWper is a threshold value with 0<SWper≤1.

According to example embodiments, a repair mechanism may be combined with the inversion of bit sequences to be stored. A repair may be provided for example whenever more than one memory cell with a permanent error is addressed and, if the error remains, the bit sequence to be stored may be inverted. The inversion of the bit sequence may take place partially, for example for the erroneous memory cells. Alternatively, the inversion may be implemented for the entire bit sequence.

According to example embodiments, a repair mechanism is provided if a non-correctable error is identified under an address.

FIG. 9 shows a schematic representation of the addressable memory 12, which comprises or has stored a code word 44'a or 44'b, the address bits $a_0$ to $a_2$, the check bits $c_0$ to $c_4$ and also the data bits $u_0$ to $u_6$. Compared with the check or data bits, as they are represented in FIG. 8, for example the memory cell 14-2, which is addressed by the first address a1,1, has another value/bit error.

In other words, FIG. 9 illustrates an example embodiment of an addressable memory in which the addresses are included in the forming of the code words of an error-correcting code, i.e. an addressable memory where address bits were used for the forming of code words.

In the example embodiment represented in FIG. 9, l=3, m=5 and k=7 are chosen. There are 8 addresses $a^0=a_0^0, a_1^0, a_2^0=[0, 0, 0]$, $a^1=a_0^1, a_1^1, a_2^1=[0, 0, 1]$, . . . , $a^7=a_0^7, a_1^7, a_2^7=[1, 1, 1]$, 5 check bits $c^i=c_0^i, c_1^i, c_2^i, c_3^i, c_4^i$ and 7 data bits $u^i=u_0^i, u_1^i, \ldots, u_6^i$. For i=0, . . . , 6, for example the bits $c^i,u^i,a^i=c_0^i,c_1^i,c_2^i,c_3^i,c_4^i,u_0^i,u_1^i, \ldots ,u_6^i,a_0^0,a_1^0,a_2^0=w^i$ in the error-free case form a code word of an error-correcting/error-identifying code $C_2$, which can be described by its H-matrix $H^2$, so that for i=0, . . . , 8

$$H^2 \cdot (c^i, u^i, a^i)^T = (\underbrace{0, \ldots , 0}_{5})^T. \tag{5}$$

The H-matrix $H^2$ is in this example embodiment $$H^2 = \begin{pmatrix} 1 & 0 & 0 & 0 & 0 & 1 & 1 & 1 & 1 & 1 & 1 & 0 & 0 & 0 & 0 \\ 0 & 1 & 0 & 0 & 0 & 1 & 1 & 1 & 0 & 0 & 0 & 1 & 1 & 1 & 0 \\ 0 & 0 & 1 & 0 & 0 & 1 & 0 & 0 & 1 & 1 & 0 & 1 & 1 & 0 & 1 \\ 0 & 0 & 0 & 1 & 0 & 0 & 1 & 0 & 1 & 0 & 1 & 1 & 0 & 1 & 1 \\ 0 & 0 & 0 & 0 & 1 & 0 & 0 & 1 & 0 & 1 & 1 & 0 & 1 & 1 & 1 \end{pmatrix}. \tag{6}$$

The first to fifteenth columns of the H-matrix $H^2$ correspond for example to the bits $c_0, \ldots, c_4, u_0, \ldots, u_6, a_0, a_1, a_2$, so that the check bits $c_0, \ldots, c_4$ are determined by $c_0=u_0+u_1+u_2+u_3+u_4+u_5$ $c_1=u_0+u_1+u_2+u_6+a_0+a_1$ $c_2=u_0+u_3+u_4+u_6+a_0+a_2$ $c_3=u_1+u_3+u_5+u_6+a_1+a_2$ $c_4=u_2+u_4+u_5+a_0+a_1+a_2$.

All of the columns of the H-matrix $H^2$ have for example an uneven number of ones and they are different in pairs. All 12 different 1-bit errors in the bits $c_0, \ldots, c_4, u_0, \ldots, u_6$ result in 12 different error syndromes, which correspond to the first 12 columns of the H-matrix $H^2$. If an error syndrome that is equal to one of these columns of the H-matrix occurs, the error corresponding to this column is corrected. Also, all of the 1-bit errors in the address bits $a_0, a_1, a_2$ lead to different error syndromes, which are equal to the last 3 columns of the H-matrix $H^2$. If an error syndrome that is equal to one of the last three columns of the H-matrix occurs, no error is corrected, but an address error is indicated, since errors in the address bits cannot be meaningfully corrected. An erroneous address leads to an erroneous memory access, which could only be corrected if it were to be replaced by a correct memory access.

Corresponding to a 1-bit error in the address bit a in $a_0'=a_0+1$ is an error syndrome $(01101)^T$, which is equal to the 13th column of the matrix $H^2$.

Corresponding to a 1-bit error in the address bit $a_1$ in $a_1'=a_1+1$ is an error syndrome $(01011)^T$, which is equal to the 14th column of the matrix $H^2$. Corresponding to a 1-bit error in the address bit $a_2$ in $a_2'=a_2+1$ is an error syndrome $(00111)^T$, which is equal to the 15th column of the matrix $H^2$. These error syndromes are different from all of the error syndromes of 1-bit errors in the check bits or the data bits, so that a 1-bit error in the address bits differs on the basis of its syndrome from all of the 1-bit errors in the check bits or the data bits and can be identified as an address error.

A 2-bit error in the address bits may lead to an error syndrome unequal to 0, which has an even number of ones. Such an error may be identified as a non-correctable error. Stored under the address a1,1=010 is for example the bit sequence 111011010010, which itself is not a code word of the code $C_2$, but when supplemented by the address bits 010 forms a code word 111011010010010 of the code $C_2$. Stored under the address a2,1=101 is the bit sequence 011111101100, which itself is not a code word of the code $C_2$, but when supplemented by the address bits 101 forms a code word 011111101100101 of the code $C_2$. It is advantageous here that the memory does not have to be increased even though the addresses have been included in the error identification and address errors can be identified. Other example embodiments envisage using, instead of the address bits, bits derived from the address bits in the forming of code words.

Thus, example embodiments envisage forming the parity of address bits P(a) and using the parity of the addresses for forming the check bits of an error-correcting code.

Similarly, according to example embodiments it is possible to use another linear function or a non-linear function f(a) of the address bits in order to form bits derived from the address bits $a=a_1, \ldots, a_l$ of the reading address during reading and of the writing address during writing or modified address bits and to use these derived or modified address bits for determining check bits of an error-identifying/error-correcting code.

FIG. 10 schematically illustrates an example embodiment of the addressable memory 12 in which the parity of the address bits is used for the forming of code words of an error-identifying/error-correcting code.

As in FIG. 8 and FIG. 9, for example l=3, m=5 and k=7 are chosen. According to other example embodiments, the values may be different and be in a relationship with a number of correctable errors.

There are 8 addresses $a^0=[0, 0, 0], \ldots, a^7=[1, 1, 1]$, 5 check bits $c^i=c_0^i, \ldots, c_4^i$ and 7 data bits $u^i=[u_0^i, \ldots, u_6^i]$, which are respectively stored under the address $a^i$ with $i=0, \ldots, 7$. The parity of the address bits P(a) is determined by $$P(a)=a_0+a_1+a_2 \qquad \text{a.}$$

of the writing or reading address a.

For $i=0, \ldots, 7$, the bits $c^i$, $u^i$, $P(a)=c_0^i, \ldots, c_4^i, u_0^i, \ldots, u_6^i$, P(a) form in the error-free case a code word of an error-identifying/error-correcting code $C_3$, which is given by its H-matrix $H^3$. The H-matrix $H^3$ is in this example embodiment $$H^3 = \begin{pmatrix} 1 & 0 & 0 & 0 & 0 & 1 & 1 & 1 & 1 & 1 & 1 & 0 & 0 \\ 0 & 1 & 0 & 0 & 0 & 1 & 1 & 1 & 0 & 0 & 0 & 1 & 1 \\ 0 & 0 & 1 & 0 & 0 & 1 & 0 & 0 & 1 & 1 & 0 & 1 & 1 \\ 0 & 0 & 0 & 1 & 0 & 0 & 1 & 0 & 1 & 0 & 1 & 1 & 0 \\ 0 & 0 & 0 & 0 & 1 & 0 & 0 & 1 & 0 & 1 & 1 & 0 & 1 \end{pmatrix}.$$

The first to thirteenth columns of the H-matrix $H^2$ correspond to the bits $c_0, \ldots, c_4, u_0, \ldots, u_6$, P(a), so that the check bits $c_0, \ldots, c_4$ are determined by $$c_0=u_0+u_1+u_2+u_3+u_4+u_5$$

$$c_1=u_0+u_1+u_2+u_6+P(a)$$

$$c_2=u_0+u_3+u_4+u_6+P(a)$$

$$c_3=u_1+u_3+u_5+u_6$$

$$c_4=u_2+u_4+u_5+P(a)$$

Stored under the address a1,1=010 is for example the bit sequence 110111010010, which when supplemented by P(010)=0+1+0=1 forms a code word 1101110100101 of the code $C_3$. Stored under the address a2,1=101 is the bit sequence 001011101100, which when supplemented by P(101)=1+0+1=0 can form a code word 0010111011000 of the code $C_3$.

FIG. 11 illustrates an addressable memory with 32 addresses $a_0, a_1, \ldots, a_{31}$ under which code words $w_0, w_1, \ldots, w_{31}$ of an error-correcting code $C_4$ are stored in memory cells in the error-free case and according to an example embodiment.

The addresses $a_1, a_{11}, a_{13}, a_{20}, a_{30}$ form by way of example the set $\alpha 1=\{a_1, a_{11}, a_{13}, a_{20}, a_{30}\}$. The set of the address $\alpha 2$ is for example $\alpha 2=\{a_0, a_2, a_3, a_4, a_5, a_6, a_7, a_8, a_9, a_{10}, a_{12}, a_{14}, a_{15}, a_{16}, a_{17}, a_{18}, a_{19}, a_{21}, a_{22}, a_{23}, a_{24}, a_{25}, a_{26}, a_{27}, a_{18}, a_{29}, a_{31}\}$. According to further example embodiments, it may be that $\alpha 2=\{a_0, \ldots, a_{31}\}$.

The addresses of the set $\alpha 1$ are the addresses for which the estimated probability that the bit sequences stored under these addresses are erroneous at the point in time t+Δt if they were error-free at the point in time t is greater than the estimated probability that the bit sequences stored under the addresses of the set $\alpha 2$ are erroneous at the point in time t+Δt if they were error-free at the point in time t.

FIG. 12 shows the occupancy of a memory in which the addresses of the set $\alpha 1$ are stored under a 3-bit address $b_0$, $b_1$, $b_2$. Stored under the addresses 0=[0,0,0], 1=[0,0,1], 2=[0,1,0], 3=[0,1,1], 4=[1,0,1] are the addresses $a_1=00001$, $a_{11}=01011$, $a_{13}=01101$, $a_{20}=10100$ and $a_{30}=11110$ of the set $\alpha 2$ and a validity bit g=1. Stored under the addresses 5,6,7, ... are any desired values and the validity bit g=0. In this case, the memory may be a volatile memory, for example an S-RAM, which is written into the memory cells of the MRAM from FIG. 11 for example during the start-up on the basis of the measured required writing current or the writing period.

The addresses of the set $\alpha 1$ may however also be stored in a nonvolatile memory. They may for example also be stored in a memory area of an MRAM, for example in the memory area of the same MRAM in which the useful data are also stored or else be stored in another MRAM. The bits $b_1, b_2, b_3$ may comprise an item of information derived from the address bits, for example on the basis of an item of parity information.

According to example embodiments it is possible that the addresses of the set $\alpha 1$ are stored redundantly, in that they are for instance stored three times or five times and are read out by way of a voter (decision circuit), so that 1-bit or 2-bit errors in one of the stored addresses of the set $\alpha 1$ are tolerated and cannot have an effect.

Other example embodiments envisage protecting the stored addresses for example of the set $\alpha 1$ by an error-correcting code, for example a Hsiao code or a BCH code (Bose-Chaudhur-Hocquenghem). This code may also be the same code that is used for coding the useful data bits or for coding the useful data bits with the inclusion of the address bits or bits derived from address bits.

In order to increase the reliability of data stored in a memory as described for example in conjunction with FIG. 11, according to example embodiments the following procedure may be followed:

At a point in time $T_1$, the addresses 0, ..., 4 are applied to the memory and the addresses $a_1, a_{11}, a_{13}, a_{20}, a_{30}$ of the set α1 that are stored in the memory are read out from this memory and applied as addresses to the memory from FIG. 11, so that the possibly erroneous bit sequences $w_1$, $w_{11}$, $w_{13}$, $w_{20}$, $w_{30}$ are read out from the memory from FIG. 11. If one of these bit sequences $w_1$, $w_{11}$, $w_{13}$, $w_{20}$, $w_{30}$ has at least one τ-bit error (i.e. a number of σ errors with σ>τ) that can be identified by the code $C_4$ and corrected, then the corresponding corrected bit sequence is written back under the same address into the memory from FIG. 11.

If for example the bit sequence $w_{20}$ read out under the address $a_{13}$ is not erroneous or it has at most one τ−1-bit error, then the bit sequence $w_{20}$ is not written back into the memory from FIG. 11. If for example the bit sequence $w_{13}$ read out under the address $a_{13}$ is erroneous and has at least one τ-bit error, and it is identified as erroneous by using the code $C_4$ and corrected in $w^{cor}$, then the corrected bit sequence $w^{cor}$ is written back into the memory from FIG. 11 under the address $a_{13}$.

The (threshold) value τ may in this case be chosen as one of the values 1, 2, . . . , t, if $C_4$ is a t-bit-error-correcting code with t≥1. This procedure may be repeated at the points in time $T_1+δ_1$, $T_1+2·δ_1$, $T_1+3·δ_1$, . . . .

If for example in an example embodiment the code $C_4$ is a 2-bit-error-correcting code, then it may be that τ=1 or 2. If for example under the address $a_{11}$ there is a 1-bit error, then it may be possible that the erroneous binary sequence $w_{11}$ read out under this address is not corrected and written back. If for example under the address $a_{20}$ there is a 2-bit error, then the erroneous binary sequence $w_{20}$ read out under this address may be corrected in $w^{cor}$ and written back.

At points in time $T_2+δ_2$, $T_2+2·δ_2$, $T_2+3·δ_2$, . . . , the bit sequences stored under the addresses of the set α2 are read out and possibly corrected if in one of the read-out bit sequences there is an identifiable and correctable i-bit error. In this case for example $δ_2>δ_1$.

It is of course also possible at the points in time $T_2+δ_2$, $T_2+2·δ_2$, $T_2+3·δ_2$, . . . to read out all of the bit sequences in the memory from FIG. 11 and in the event of an error write them back.

According to example embodiments it is also possible to divide the addresses into more than 2 subsets α1, α2, α3, . . . , and to read out at the points in time $T_1+δ_1$, $T_1+2·δ_1$, $T_1+3·δ_1$, . . . the bit sequences read out under the addresses of α1 and in the event of an error write them back, to read out at the points in time $T_2+δ_2$, $T_2+2·δ_2$, $T_2+3·δ_2$, . . . the bit sequences read out under the addresses of α2 and in the event of an error write them back, to read out at the points in time $T_3+δ_3$, $T_3+2·δ_3$, $T_3+3·δ_3$, . . . the bit sequences read out under the addresses of α3 and in the event of an error correct them, . . . , where $δ_1>δ_2>δ_3$. It is also unnecessary in this case that the reading out and possible writing back respectively take place at the same time interval. The same interval $δ_i$ is used here for the sake of better understanding.

The use of a t-bit-error-correcting code with t≥2 surprisingly allows the set α1 of the addresses that are frequently read out and in the event of an error are to be written back in corrected form to be chosen to be considerably smaller than if only a 1-bit-error-correcting code is used. If the probability that a memory cell is erroneous at a point in time t+Δt if it was error-free at a point in time t is p, then the probability that at the same time two memory cells of N memory cells are erroneous at the point in time t+Δt if they were error-free at the point in time t is according to a binomial distribution $$\binom{N}{2} \cdot p^2 \cdot (1-p)^{N-2} < p$$

where it can be assumed that memory cells become erroneous independently of one another. In this case, N=k+m, where k is the number of useful data bits and m is the number of check bits of the code under consideration.

In the case of a 2-bit-error-correcting code $C_{cor}$, for example only the addresses that address two memory cells which at the point in time t+Δt have a relatively great estimated probability that they are erroneous if they were error-free at the point in time t can be assigned to the set α1. These may be such memory cells that have a writing current above a certain threshold value, as described for example in conjunction with FIG. 6.

This may result in a smaller set α1 of addresses that are read more frequently and in the event of an error are written back in corrected form than if the set α1 of addresses that are read more frequently and in the event of an error are written back in corrected form is selected as the set of addresses that address at least one memory cell which at the point in time t+Δt has a relatively great estimated probability that it is erroneous if it was error-free at the point in time t, which may be advantageous since the required expenditure of time and expenditure of electrical power can be reduced.

With respect to the addresses 000, 001, 010, 011 and 100, there may be a first item of partial reliability information 22'. With respect to the address 101, there may for example be a second item of reliability information or partial reliability information 22". The reliability information 22 may comprise the items of partial reliability information 22' and 22". For example, the address a3,1 (101), which may be assigned to a third subset α3 of addresses, is read out with a lower frequency than the addresses 0-4 and with a higher probability than the address 6 or 7.

Alternatively or in addition, an address may also be assigned in no subset of addresses or in more than two subsets of addresses.

In other words, FIG. 12 shows a memory for storing addresses which address erroneous memory cells with a greater probability than other addresses.

FIG. 13 shows a schematic block diagram of a circuit arrangement for storing coded data in the addressable memory 12 or a block diagram of a memory device 130. Useful data 52 to be coded (identified by u) may be present at an input 54 of a coder (memory controller) 56. At a data output 58 of the coder 56, which is connected to a data input 62 of the addressable memory, coded data w=c,u (i.e. the bit sequence w comprises the bits c and the bits u) may be output and stored under an address a present at an address input 64 of the addressable memory 12. For example, the coded data w=c,u may be the code word 42 of the error-correcting code $C_{cor}$. Alternatively, it may be a code word 42', 44 or 42'.

In other words, FIG. 13 shows a memory with an upstream coder.

FIG. 14 shows a schematic block diagram of a circuit arrangement (memory device) 140 for storing coded data in the addressable memory 12. A coder (memory controller) 56' may be designed to obtain the data 52 to be coded at the input 54. At a further input 66, the coder is designed to obtain the address bits of the writing address a. At the data output 58 of the coder 56', which is coupled to the data input 62 of the addressable memory 12, check bits c and the useful data bits u may be output and stored in the addressable memory 12 under the address a that is present at the address input 66. Bits c, u, a may form the code word w of the error-correcting code $C_{cor}$. Compared with FIG. 13, for example no code words of an error-identifying/error-correcting code are stored in the addressable memory 12. In the error-free case, the bits stored under an address a form together with the address a present at the address input 64 of the addressable memory 12 a code word of the code $C_{cor}$.

This means that the memory device 140 is designed to store the bit sequences in the addressable memory 12, the bit sequence being part of the code word of the error-correcting code. On the other hand, the memory controller 56 of the memory device 140 may be designed to store bit sequences that form a code word of the error-correcting code.

In other words, FIG. 14 shows a memory with an upstream coder, address bits being used for the forming of code words.

FIG. 15 shows a schematic block diagram of a memory device 150 for storing coded useful data in the addressable memory 12. The useful data u or 52 to be coded may be present at the first input 54 of the coder 56', while modified address bits A, with A=f(a), of the writing address a are present at the second input 66. f may be for example a single-valued function of the address bits a.

For example, it may be that $A=f(a)=f(a_0, \ldots, a_{l-1})= a_0+a_1+\ldots+a_{l-1}$, so that in this case the modified address bits, i.e. bits derived from the address bits, consist of a bit which is the parity of the address bits. Alternatively, the single-valued function may also be some other single-valued mapping, for example a binary value of the number of zeros of the address. At the data output 58 of the coder 56', which is connected to the data input 62 of the addressable memory 12, check bits c and the useful data bits u may be output and stored in the addressable memory 12 under the address a present at the address input. Bits c, u and A may form a code word of the error correcting code. The bits c and u may be bits of a code word comprising bits c,u,A of the error-correcting code $C_{cor}$. The coders 56 and/or 56' may for example be the memory controller 18.

In other words, FIG. 15 shows a memory with an upstream coder, it being possible for example for parity bits from address bits to be used for the forming of code words.

FIG. 16 shows a schematic block diagram of a memory device 160 comprising the addressable memory 12 and the memory controller 18. The memory controller 18 may for example comprise the following: a syndrome generator 84, an error detector 86, an error corrector 88, an XOR circuit 92, an AND gate 94, an AND gate 96, a first address generator Ad1 98, an address memory 102, a second address generator Ad2 104 and a multiplexer 106. Other memory devices may have other components. This means that the memory device may have an address value memory 102 for storing an address bit sequence comprising the bits of the first address a1,1. The bits of the first address may be stored redundantly in the address value memory, so that at least a number of one error in the redundantly stored address bits of the address a1,1 is identifiable and/or correctable.

In other words, it is possible that the bit sequences $c^0, u^0$; $c^1; u^1; \ldots; c^{max}, u^{max}$ can be stored in the addressable memory 12 under the addresses $a^0, a^1, \ldots, a^{max}$, so that in the error-free case $c^0, u^0; a^0; c^1; u^1; a^1; \ldots; c^{max}, u^{max}, a^{max}$ are code words of the error-correcting code $C_{cor}$. It is possible that the circuit arrangement represented can be used for correcting erroneous memory cells.

According to an example embodiment, a function of the device that is given by way of example may be described as follows. At a first point in time t, for example the bit sequences from the memory 12 that are stored under the addresses from α1 are read and, if a correctable error has occurred, are written back. As at the point in time t, for example at the points in time $t+\delta_1, t+2\cdot\delta_1, t+3\cdot\delta_1, \ldots$ the bit sequences from the memory 12 that are stored under the addresses from α1 are read. If a correctable error has occurred, the corrected bit sequences are written back. A reading out for the error correction of the bit sequences stored under the addresses from α1 takes place at the time interval $\delta_1$. If a correctable error has occurred, the read-out bit sequences are then corrected and for example written back under the address from which they were read out.

In the first addressable memory or address memory 102, the addresses from α1 are stored for example continuously. The first address generator Ad1 98 is configured here as a counter. Its output is connected to the address input of the address memory 102. If the values 0, 1, 2, . . . are output by the address generator configured as a counter as addresses for the address memory, then the addresses a1,1, a1,2, a1,3, . . . are output by the address memory 102. If the value of the control signal st of the multiplexer 106 is equal to 0, then the multiplexer 106 connects its 0 input to its output. At the address input of the memory 12, the addresses a1,1, a1,2, a1,3, . . . are present as address a'. The memory 12 outputs at its data output the possibly erroneous bit sequence c',u' stored under the address a', which has been caused by possible errors from the correct bit sequence c, u.

The possibly erroneous bit sequence c',u' is present at a first input of the syndrome generator 84, while the possibly erroneous address a' is present at a second input of the syndrome generator 84, which at its output outputs an error syndrome s. The possibly erroneous bit sequence c',u' is at the same time present at a first input of the XOR circuit 92 for the componentwise XOR operation. The output of the syndrome generator 84 that carries the error syndrome s is connected to the input of an error identifier or error detector 86 and at the same time connected to the input of the error corrector 88, which at its output outputs a correction vector e for the bitwise correction of the bits of the possibly erroneous binary sequence c',u'. The output of the error corrector 88 is led into a second input of the XOR circuit 92, which realizes a bitwise XOR operation on the corresponding bits of c',u' and e and at its output outputs the corrected value $(c, u)^{cor}$.

The output of the XOR circuit 92 is led into the data input of the memory 12. The error detector 86 forms a 1-bit-wide error signal E, which is then equal to 1 if there is at least one τ-bit error with 1≤τ≤t, the erroneous binary sequence c',u' being corrected and written back, and $C_{cor}$ being a t-bit-correcting code.

The output of the error detector 86 that carries the error signal E is connected to a first input of an AND gate 96 and by way of a negator to an AND gate 94, at the first inputs of which respectively a binary read/write signal r/w is present, and at the same time is connected to a 1-bit-wide input of the address generator Ad1 98 and of the address generator Ad2 104.

If the signal r/w=1, then read=1 when E=0 and read=0 when E=1. The address generator Ad1 98 addresses the address memory 102, which during the respective application of an address generated by the address generator Ad1 98 outputs an address a from α1, which by way of the multiplexer 106 is present at the address input of the memory 12. If the read signal is read=1, then the memory 12 outputs the bit sequence c,u stored under the address a. The syndrome generator 84 forms from the possibly erroneous address bit a and the possibly erroneous bit sequence c, u an error syndrome s, from which the error detector 86 determines an error signal E and the error corrector 88 determines a correction vector e. The address generator Ad1 98 is configured such that, whenever E=0, it outputs the next address. If E=0, then the write signal is write=0 and the read signal is read=1. The control signal st of the multiplexer continues to be st=0, so that then a further address from α1 that is output by the address memory 102 is present at the address input of the memory 12.

If the error signal is E=1, then the write signal is write=1. The address generator Ad1 98 is configured such that it does not output a new address as long as E=1, so that the existing address a continues to be present at the address input of the memory 12 and the corrected bit sequence cu$^{cor}$ is written into the memory 12 under the address a, so that the erroneous bit sequence stored under the address is written back in corrected form if the error can be corrected by the code $C_{cor}$ and the address is error-free.

Writing back only takes place if the bit sequence stored under an address from α1 is erroneous and can be corrected by the code $C_{cor}$. An address error is identified as a non-correctable error.

If the control signal st of the multiplexer 106 is equal to st=1, then the multiplexer 106 connects its 1 input to its output and the addresses generated by the address generator Ad2 104 are present at the address input of the memory 12. At the points in time T, T+δ$_2$, T+2δ$_2$, T+3δ$_2$, . . . , the control signal st is chosen as st=1 and is in each case kept at this value until the address generator Ad2 104 has generated all of the addresses that are read at the greater time intervals and in the event of an error are written back in corrected form. Example embodiments provide that, for the purpose of correction of erroneous values in the memory, all of the addresses of the memory 12 are read by the address generator Ad2 at the points in time T, T+δ2, T+2δ2, T+3δ2, . . . and, in the event of an error, are written back in corrected form. If an error to be corrected is identified, then E=1 and the read signal read assumes the value 0 as the output of the AND gate 94, while the write signal write assumes the value 1 as the output of the AND gate 94, so that the corrected bit sequence c, u$^{cor}$ is written into the memory 12 under the address a. The error signal E is also passed to an input of the address generator Ad2, the address generator Ad2 being designed such that, when an error signal E=1 is present, it retains the existing address.

The address generator Ad1 98 addresses the address memory 102, which during the respective application of an address generated by the address generator Ad1 98 outputs an address a from α1, which by way of the multiplexer 106 is present at the address input of the memory 12. If the read signal is read=1, then the memory 12 outputs the bit sequence c,u stored under the address a. The syndrome generator 84 forms from the possibly erroneous address bit a and the possibly erroneous bit sequence c, u an error syndrome s, from which the error detector 86 determines an error signal E and the error corrector 88 determines a correction vector e. The address generator Ad1 98 is configured such that, whenever E=0, it outputs the next address. If E=0, then the write signal is write=0 and the read signal is read=1. The control signal st of the multiplexer continues to be st=0, so that then a further address from α1 that is output by the address memory 102 is present at the address input of the memory 12.

If the error signal is E=1, then the write signal is write=1. The address generator Ad1 98 is configured such that it does not output a new address as long as E=1, so that the existing address a continues to be present at the address input of the memory 12 and the corrected bit sequence cu$^{cor}$ is written into the memory 12 under the address a, so that the erroneous bit sequence stored under the address is written back in corrected form if the error can be corrected by the code $C_{cor}$ and the address is error-free.

Writing back only takes place if the bit sequence stored under an address from α1 is erroneous and can be corrected by the code $C_{cor}$. An address error is identified as a non-correctable error.

At the points in time T, T+δ2, T+2δ2, . . . , the control signal st assumes the value st=1 until the addresses generated by the address generator Ad2 have been read out from the memory 12. In this case it is possible that the address generator Ad2 104 sequentially generates all of the addresses of the memory 12 or that it outputs addresses of an address area.

In the same way as the generation of a following address for the address generator 104 is determined by the error signal E, the generation of a following address for the address generator 810 is determined by the error signal E. The reading out and correction of the data that are stored under an address generated by the address generator Ad$^2$ 104 takes place by analogy with the reading out and correction of the data that are stored under an address output by the address generator 102.

According to further example embodiments it is also possible to change dynamically the set α1 of the addresses that are read more frequently than other addresses and, in the event of an error, are corrected and written back. Thus it is possible for example to determine the set α1 during the start-up on the basis of measurements of physical parameters of the memory cells, for instance in that the memory controller determines the physical parameter. Thus, if the addresses of α1 are respectively read out beginning at the points in time $T_1+\delta_1$, $T_1+2\cdot\delta_1$, $T_1+3\cdot\delta_1$, . . . , $T_1+R\cdot\delta_1$, then the memory controller can determine or estimate how often the bit sequence stored under an address $a_{1,i} \in \alpha_1$ is erroneous when reading out is performed S times and can be corrected by using the error-correcting code that is used, cf. method 1550. Reading out S times may relate to an absolute number, to a number within a time period or to a (relative) number of the error-affected reading-out operations in relation to all of the reading-out operations.

It can also be established, for example by the memory controller, whether a binary sequence stored under an address a1,i∈α1 was erroneous at all when reading out is performed R times. If the binary sequences read out under the address a1,i at the various R points in time are always error-free, then the address $a_{1,i}$ can be deleted from the set α1 and added to the set α2.

It is possible for example to add to the addresses of $\alpha_1$ that are stored in the address memory 102 a further bit bw, which is initially set to the value 0. If an address a1,k from α1 is read out from the address memory 102, and applied to the data memory 12, then the data memory 12 outputs a possibly defective bit sequence c',u' stored under the address a1,i. If the output bit sequence c',u' is erroneous and it is corrected by using the error-correcting code and written back, then the value of the further bit bw can be set to the value bw=1, irrespective of whether it had the value 0 or 1. If the read-out bit sequence c',u' is not erroneous, then the value of the further bit bw is retained. If, after reading out of the bit sequence stored in the data memory 12 under the address a1,i∈α1 has been performed R times with R>0 and possibly erroneous read-out bit sequences have been corrected and written back, the value of the further bit is bw=0, then the bit sequence stored under the address a1,i was always error-free during the reading out R times. It is then possible to remove this address from α1 and to assign it to another set of addresses, for example the set α2.

The memory controller may be designed to use a t-bit-error-correcting code $C_{cor}$ with t≥2. This makes it possible to assign an address a2,j∈α2 to the set α1 whenever during a memory access to the data memory 12 under the address a2,j a bit sequence c',u' that has a τ-bit error is output, where it can be chosen that 1≤τ≤t. If for example t=2, then a 1-bit error can be corrected, without the address a2,j being assigned to the set α1 after the identified 1-bit error. If a 2-bit error occurs, then the address a2,j can be removed from the set α2 and assigned to the set α1.

It may be sufficient only to store the set $α_1$ of the addresses that are to be read frequently in an address memory 102 and not to store the set $α_2$ of the addresses that are to be read less frequently in an address memory and, whenever the addresses from α are read for the purpose of error correction of the stored values and, in the event of an error, are corrected, also at the same time to read and possibly correct the addresses from α1.

Subsets α1 and α2 may be disjunctive or non-disjunctive. If an address a belongs both to α1 and to α2, then it is read both when the addresses from α1 are read and when the addresses from α2 are read. It may however be important that an address that is to be read frequently belongs to α1.

The examples of the dynamic changing of the sets of addresses that are described are examples of a possible dynamic changing of the sets of addresses.

FIG. 17 shows a schematic flow diagram of a method 1700 and a method 1750, which can be implemented for example by a memory controller in order to influence or change an assignment of addresses to a subset. In a step 1710, the memory controller may be designed to read out an address of the second subset and to assign the address to the first subset if, when reading out the stored bit sequence for a predetermined σ, the memory controller identifies a number of σ errors in the read-out bit sequence, where 1≤σ≤t. The code may be a t-bit-error-identifying and/or error-correcting code with t≥1.

In a step 1720, the memory controller may assign the read-out address to the first subset α1 of addresses if an error is identified in the read-out bit sequence. For example, the memory controller may be designed to correct a first error in the read-out bit sequence. The memory controller may be designed to add an address to the first subset α1 of addresses if the bit sequence read out under the address is not assigned to the subset α1 and if an error has occurred when reading the bit sequence stored under this address S' times, where 1<S'. This means that a bit sequence that repeatedly has errors can be added by the memory controller to the first subset of addresses.

By means of the method 1750, the memory controller may for example be designed to remove an address a1,j of the first subset α1 from the subset α1 if no error has occurred when the bit sequence stored under this address is read S times in a step 1760, where 1<S. If no error occurs S times, the memory controller may be designed to remove the address from the first subset α1 and/or assign it to the second subset α2 in a step 1770. This means that a memory controller, for instance the memory controller 18, may be designed to remove an address of the first subset α1 from the subset α1 if no error has occurred when the bit sequence stored under this address is read S times, where 1<S.

According to example embodiments, the memory controller may be designed to change the first subset α1 in dependence on errors occurring when reading out bit sequences stored in the addressable memory and/or in dependence on values of a physical parameter determined when writing into the addressable memory and/or when reading out from the addressable memory. For example, the physical parameter may change during operation or over an operating period of the addressable memory. The control device may be designed to determine i.e. to record, the changing, and to adapt the assignment of the first or second subset of addresses.

FIG. 18 shows a schematic block diagram of a memory device 180, which comprises the addressable memory 12 for storing bit sequences and a memory controller 18'. In the error-free case, the stored bit sequences are bits of a code word of an error-correcting code, i.e. at least part of the code word. The memory controller 18' is designed to provide for a correction of erroneous contents by reading out the stored bit sequences from the addressable memory 12 in order to carry out a reading-out operation. The error-correcting code may be a t-bit-correcting code with t≥2.

The memory controller 18' may be designed to correct a stored and read-out erroneous bit sequence that has a number of a bit errors by using the error-correcting code and to overwrite the erroneous bit sequence with a corrected bit sequence and/or to write back the corrected bit sequence, where 1<σ≤t. The memory controller may be designed not to overwrite the erroneous bit sequence with a corrected bit sequence and not to write back the corrected bit sequence if the read-out bit sequence has a number of σ errors and σ≤τ, where τ is a threshold value and 1≤τ≤t. With respect to a differentiation as to whether or not an erroneous bit sequence is written back, the memory device 180 may have a function that is comparable to a function such as described for instance in conjunction with FIG. 5.

As described in conjunction with FIG. 3, the addressable memory may have first memory cells, which are addressed by the first address a1,1. The addressable memory may have second memory cells, which are addressed by a second address a2,1, which is different from the first address. The bit sequences stored under the address a1,1 and the address a2,1 may in the error-free case respectively be a bit of a code word of an error-correcting code. The memory controller may be designed to provide for a correction of erroneous contents in the stored bit sequences by reading out the first and/or second memory cells. The bit sequences stored under the address a1,1 and the address a2,1 may in the error-free case respectively be bits of a code word of an error-correcting code. The memory controller may be designed to provide for a correction of erroneous contents in the stored bit sequences by reading out the first and/or second memory cells in order to carry out a reading-out operation. A frequency of successive operations of reading out the first memory cells and the second memory cells may be different if an item of reliability information is available for the first memory cells and/or the second memory cells. The reliability information may be based on an ascertained probability of an occurrence of an erroneous bit sequence in the first memory cells and/or the second memory cells.

Further example embodiments provide memory devices that develop the memory device 180 with respect to an evaluation and/or correction of the memory cells with a varying frequency, as explained in conjunction with the other example embodiments described herein. This means that the described features of the example embodiments explained above can be readily transferred to the memory device 180.

FIG. 19 shows a schematic representation of a distribution of bits (memory cells) over various thermal stabilities ΔE[kBT]. The thermal stability may be usable as a physical parameter. For example, addresses that are addressed by the memory cells and have a deviation from a mean value greater than σ, greater than 2 σ or greater than 3 σ may be stored as first addresses, where σ here denotes a variance of a distribution.

FIG. 19 shows that a great variation of the thermal stability ΔE can occur in an MRAM memory.

FIG. 20 shows a schematic diagram of a probability distribution P that a bit has a bit error within a time interval after a writing operation. Over different periods of time (one second, 10 000 seconds, $10^8$ seconds, which corresponds to approximately 3.1 years) it becomes evident that a probability that a bit error is present may be based on the time period that is used, on the type of error-correcting code that is used, for example a bit-error-correcting code—or error correction code, ECC- or a 3-bit-error-correcting code and/or on the thermal stability ΔE. These relationships can be taken into account as an estimated probability in the differentiation into first addresses and second addresses.

Expressed in simplified terms, FIG. 20 shows a relationship between a physical parameter, i.e. the thermal stability, and a probability of an occurrence of a bit error.

FIG. 21 shows a schematic flow diagram of a method 2100 comprising a step 2110. The method 2100 may be implementable by a memory device 10. In the step 2110, a checking of a first bit sequence, which is stored in first memory cells of a memory, takes place, the memory having second memory cells, which are different from the first memory cells and in which there is stored a second bit sequence. The first bit sequence is checked with a frequency that is assigned to the first memory cells and is dependent on an item of reliability information for the first memory cells. In the case of an error state, an erroneous bit of the first bit sequence is corrected and at least the corrected bit is written back into the memory. The second bit sequence is checked less often than the first bit sequence on the basis of an item of reliability information for the second memory cells.

FIG. 22 shows a schematic flow diagram of a method 2200, as can be implemented for example by the memory devices described herein. The method 2200 may be used to keep down a number of bit errors in a memory with low efficiency, for example if it is implemented by the memory device 30.

In a step 2210, bit sequences are stored in an addressable memory that has first memory cells, which are addressed by a first address a1,1, and that has second memory cells, which are addressed by a second address a2,1, which is different from the first address, the bit sequences stored under the first address a1,1 and the second address a2,1 in the error-free case respectively being bits of a code word of an error-correcting code.

In a step 2220, the first and/or second memory cells are read out to provide for a correction of erroneous contents in the stored bit sequences by implementing a reading-out operation, a frequency of successive operations of reading out the first memory cells and the second memory cells being different if an item of reliability information is available for the first memory cells and/or the second memory cells, the reliability information being based on an ascertained probability of an occurrence of an erroneous bit sequence in the first memory cells and/or the second memory cells.

FIG. 23 shows a schematic flow diagram of a method, as can be implemented for example by the memory device 180 and/or in addition by other memory devices described herein. The method may be used to correct bit errors with little effort.

In a step 2310, bit sequences are stored in an addressable memory, so that in the error-free case the stored bit sequences are respectively bits of a code word of a t-bit-error-correcting code and t≥2.

In a step 2320, to provide for a correction of erroneous contents the stored bit sequences are read out in order to carry out a reading-out operation.

In a step 2330, a stored and read-out erroneous bit sequence is corrected, the bit sequence having a number of σ errors. The correction takes place by using the error-correcting code. In a step 2340, the erroneous bit sequence is overwritten with a corrected bit sequence and/or the corrected bit sequence is written back, it being the case that 1<σ≤t. The erroneous bit sequence is not overwritten with a corrected bit sequence and the corrected bit sequence is not written back if the read-out bit sequence has a number of σ errors and σ≤τ, where τ is a threshold value and 1≤τ≤t.

FIG. 24 shows a schematic representation of a bit sequence 112 to be stored, which can be stored as a bitwise-inverted bit sequence 112' in an addressable memory, for instance if the address under which the bit sequence is stored is identified by the memory device as address aper,1, which has a permanently defective memory cell 114, which is for example "stuck at 0", i.e. stuck at a value of 0. The bit sequence 11001 cannot be stored error-free in the memory cells under the address aper,1, while the inverted bit sequence 00110 can be stored error-free under the address aper,1. According to example embodiments, the entire bit sequence may be inverted. According to further example embodiments, the bit sequence may be partially inverted, the part comprising at least the bit that is stored in the erroneous bit sequence. The memory cell 114 or the address aper,1 may for example be stored in the subset αper of addresses.

FIG. 25 shows a schematic representation, of a classification of the memory cell 114 as having a permanent error. On the basis of a physical parameter that is greater or less than a threshold value it is possible to ascertain a probability pper, which indicates how likely it is that the memory cell 114 has a permanent error. If the probability is greater than a threshold value SWper, the address aper,1 may be assigned to the subset αper, for example by the memory controller. The threshold value may be greater than 0 and less than or equal to 1, greater than or equal to 0.1 and less than or equal to 0.99 or greater than or equal to 0.2 and less than or equal to 0.95.

Example embodiments described above make an efficient error correction in addressable memories possible, in particular in MRAM memories. These have for example a small proportion of cells that often have errors. The other cells have an error less frequently. Addresses may be regarded or classified as a first address if they address at least one memory cell that has a frequent error probability.

Expressed in simplified terms, memory cells that are not reliable (unreliable) can be predicted (for example during a start-up, possibly by evaluating the writing current or the reading current). Unreliable addresses can be determined and stored in different types of memories.

Bit sequences (words) that are stored in unreliable addresses are read more often and for example only corrected if a correctable error is established and corrected. Bit sequences in reliable addresses are read less often and are only written back, i.e. restored, in cases in which a correctable error has been corrected. This makes possible a reduction in the expenditure with respect to time and energy consumption, in particular in MRAM memories. Unreliable addresses may be stored in volatile memories or nonvolatile memories. Alternatively or in addition, they may be stored in a special memory area in the same memory where the data are stored on the addressable memory. This makes it possible that the values of the unreliable addresses are also corrected by the error-correcting code. Unreliable addresses may be tripled and stored.

A compilation of unreliable addresses may be dynamically changed during operation of the memory device. For example, addresses with multibit errors may be included in the compilation of unreliable addresses. Addresses of the unreliable addresses may be removed from the compilation if they do not have an error for a certain time, possibly a long time.

If a t-bit-error-correcting code with t≥2 is used, data that are stored under a reliable or unreliable address can for example be corrected and restored if there is at least one 2-bit error. In the case for example of a 1-bit error, the error may be corrected or remain uncorrected and not be restored. Consequently, the expenditure (overhead) for the restoration can be reduced significantly, since the probability of a 2-bit error, in the case of which a restoration takes place, is much lower than the probability of a 1-bit error. More than 2 different types of addresses may be implemented.

Example embodiments may also be drafted such that, for a method for reducing the number of errors of bit sequences stored in an addressable memory, the addressable memory has first memory cells, which are addressed by a first address a1,1, and second memory cells, which are addressed by a second address a2,1, which is different from the first address, the estimated probability that an error-free bit sequence stored in the first memory cells under the first address a1,1 at a point in time t is erroneous at the point in time t+Δt being greater than the estimated probability that a correct bit sequence stored in the second memory cells under the second address a2,1 at the point in time t is erroneous at the point in time t+Δt, where Δt>0, and the bit sequences stored under the address a1,1 and the address a2,1 in the error-free case respectively being bits of a code word of an error-correcting code $C_{cor}$ with a code interval d≥3, the first memory cells under the address a1,1 being read more frequently at successive points in time than the second memory cells under the address a2,1 for the correction of erroneous contents of memory cells, and that an erroneous bit sequence that is stored under the address a1,1 and read out is overwritten with a bit sequence corrected by using the code $C_{cor}$.

Further example embodiments define that the code $C_{cor}$ is a t-bit-correcting code and t≥2, the erroneous bit sequence being overwritten with a bit sequence corrected by using the code $C_{cor}$ or written back if a bit sequence that is stored under the address a1,1 and read out has a t-bit, (t−1)-bit, . . . , or τ-bit error, where τ≤1.

Further example embodiments define that whenever a bit sequence that is stored under the address a1,1 and read out has a σ-bit error and σ≤T, the erroneous bit sequence with an σ-bit error is not overwritten with a corrected bit sequence or written back.

Further example embodiments define that, at successive points in time at which the first memory cells are read under the address a1,1 and at which an error in the read-out bit sequence is corrected by the code $C_{cor}$, the first memory cells are overwritten with the corrected bit sequence and, at the points in time at which the first memory cells are read under the address a1,1 at which no error in the read-out bit sequence is corrected by the code $C_{cor}$, the first memory cells are not overwritten with a bit sequence.

Further example embodiments define that, at successive points in time at which the first memory cells are read under the address a1,1 and at which no error in the read-out bit sequence is corrected by the code $C_{cor}$ or identified, the first memory cells are overwritten with the read-out bit sequence.

Further example embodiments define that the estimated probability that an error-free bit sequence stored in the first memory cells under the first address a1,1 at a point in time t is erroneous at a point in time t+Δt is determined by using a value of at least one physical parameter.

Further example embodiments define that the value of the at least one physical parameter is the value of the writing current or the value of the reading current of a memory cell.

Further example embodiments define that under the address a1,1 there is stored a bit sequence which consists of data bits and check bits, the data bits and the check bits in the error-free case forming a code word of the error-correcting code $C_{cor}$.

Further example embodiments define that under the address a1,1 there is stored a bit sequence which consists of data bits and check bits, the data bits and the check bits and the address bits of the address a1,1 or bits derived from the address bits of the address a1,1 in the error-free case forming a code word of the error-correcting code $C_{cor}$.

Further example embodiments define that the memory has along with the address a1,1 further addresses a1,2, . . . , a1,m with m>1, which form a first subset α1={a1,2, . . . , a1,m}, and along with the address a2,1 further addresses a2,2, . . . , a2,M with M>1, which form a second subset α2={a2,2, . . . , a2,M}, the estimated probability that an error-free bit sequence stored in the first memory cells under an address a1,i with i∈{1, . . . , m} at a point in time t is erroneous at a point in time t+Δt being greater than the probability that a correct bit sequence stored in the second memory cells under an address a2,j with j∈{1, . . . , M} at the point in time t is erroneous at the point in time t+Δt, where Δt>0, and the bit sequences stored under the address a1,i and the address a2,j in the error-free case respectively being bits of a code word of an error-correcting code $C_{cor}$, the memory cells under the address a1,i being read more frequently at successive points in time, and overwritten with a bit sequence determined from the read-out bit sequence and corrected by using the code $C_{cor}$ whenever the read-out bit sequence is erroneous and the erroneous bit sequence can be corrected by using the code $C_{cor}$, than the memory cells under the address a2,1.

Further example embodiments define that subset α1 is determined during the start-up.

Further example embodiments define that the first subset α1 or the second subset α2 is stored in a volatile memory.

Further example embodiments define that the first subset α1 or the second subset α2 is stored in a nonvolatile memory.

Further example embodiments define that the subset α1 is stored in the same memory where the binary sequence stored under the address a1,1 is also stored.

Further example embodiments define that the subset α1 is stored in a memory where the binary sequence stored under the address a1,1 is not stored.

Further example embodiments define that the set α1 is changed in dependence on errors occurring when reading out binary sequences stored in the memory or on values of physical parameters determined when writing into the memory or when reading out from the memory.

Further example embodiments define that the binary sequences that are stored under the addresses a1,1, . . . , a1,m are bits of a t-bit-error-identifying/correcting code with $t \geq 1$ and, whenever a $\tau$-bit error, with $1 \leq \tau \leq t$, is identified when reading out a binary sequence for a prescribed T stored under an address a, where the address is not an element of $\alpha 1$, a is added to the set $\alpha 1$.

Further example embodiments define that there is an address a that is replaced by another address in a repair process.

Further example embodiments define that there is a set $\alpha$per of addresses, so that, with an estimated probability pper, memory cells that are stored under an address from the set $\alpha$per have a memory cell with a permanent error, where pper SWper, where SWper is a threshold value with $0<$SWper$\leq 1$ and memory cells which are addressed by an address $a \in \alpha$per and for which an error is identified are described by a bitwise inverted binary sequence.

Further example embodiments define that an address $a1,j$ of the set $\alpha 1$ is removed from the set $\alpha 1$ if no error has occurred when reading of this address is performed S times and $1<S$.

Further example embodiments define that the bits of the address $a1,1$ are stored redundantly in memory cells, so that at least 1-bit errors in the address bits of the address $a1,1$ can be identified and/or corrected.

Example embodiments described above make it possible to read out more unreliable memory cells, which have a greater error probability, more frequently. At the same time, example embodiments make it possible to retain the efficiency of correction mechanisms to a great extent, since memory cells that do not have all that great an error probability are not read out more frequently. When there is a greater probability of the presence of an erroneous bit sequence in the first memory cells in comparison with the probability of the presence of an erroneous bit sequence in the second memory cells, the frequency of the reading out at successive points in time of the first memory cells may be higher than the frequency of the reading out at successive points in time of the second memory cells.

Example embodiments described above make it possible to determine a subset of addresses of an MRAM which address memory cells that have errors with a relatively great probability and for example have a low thermal stability, the error-free bit sequences that are stored under these addresses being bits of a code word of an error-correcting code $C_{cor}$. Only whenever an error that can be corrected by the code $C_{cor}$ occurs in the read-out bits is the error corrected and the corrected bits stored in the MRAM, for example under the same address under which the bits were read out.

In this case it is possible that memory cells that have errors with a relatively great probability are addressed more frequently for the purpose of error correction than other memory cells that have no errors with a relatively great probability.

The fact that the number of memory cells that have a relatively great probability of errors is relatively small and that a writing back of corrected data only takes place when an error has actually occurred in an addressed memory cell means that the effort for the correction is reduced.

In this case it is possible that the probability that an error occurs in a memory cell is estimated or predicted on the basis of measurements of physical parameters during the writing or during the reading. Such a parameter may be for example a writing current, a writing period or a reading current. In this case it is not necessary to predict specific numerical values for this probability. It is often sufficient to predict that the memory cell under consideration is erroneous with a small probability or with a great probability.

It is however also possible to estimate a probability on the basis of statistical observations of the errors that have occurred or to modify a probability estimated on the basis of measurements of physical parameters on the basis of observations of errors. Reference is made below to an estimated or predicted probability. It is possible in this case that it is an estimated numerical value for this probability or that it is a matter of stating that the probability assumes a relatively small or a relatively great value.

The selection of addresses may take place for example by it being established, for instance by the memory controller, that at least one memory cell that has a great probability of being erroneous is addressed under the address. The selection of the addresses may however also take place by it being established whether at least 2 or at least 3 or generally a number of memory cells that have a great probability of being defective are addressed by the address.

Although some aspects have been described in conjunction with a device, it goes without saying that these aspects also represent a description of the corresponding method, so that a block or a component of a device should also be understood as a corresponding method step or as a feature of a method step. By analogy with this, aspects that have been described in conjunction with a method step or as a method step also represent a description of a corresponding block or detail or feature of a corresponding device.

Depending on certain implementation requirements, example embodiments of the disclosure may be implemented entirely or partially in hardware or in software. The implementation may be carried out by using a digital storage medium, for example a floppy disk, a DVD, a Blu-ray disk, a CD, a ROM, a PROM, an EPROM, an EEPROM or a FLASH memory, a hard disk or some other magnetic or optical storage device on which there are stored electronically readable control signals which can interact or do interact with a programmable computer system in such a way that the respective method is carried out. For this reason, the digital storage medium may be computer-readable. Some example embodiments according to the disclosure therefore comprise a data carrier which has electronically readable control signals that are capable of interacting with a programmable computer system in such a way that one of the methods described herein is carried out.

Generally, example embodiments of the present disclosure may be implemented as a computer program product with a program code, the program code being operative to the effect of carrying out one of the methods if the computer program product runs on a computer. The program code may for example also be stored on a machine-readable carrier.

Other example embodiments comprise the computer program for carrying out one of the methods described herein, the computer program being stored on a machine-readable carrier.

In other words, an example embodiment of the method according to the disclosure is consequently a computer program that has a program code for carrying out one of the methods described herein when the computer program runs on a computer. A further example embodiment of the methods according to the disclosure is consequently a data carrier (or a digital storage medium or a computer-readable medium) on which the computer program for carrying out one of the methods described herein is recorded.

A further example embodiment of the method according to the disclosure is consequently a data stream or a sequence of signals that represents or represent the computer program for carrying out one of the methods described herein. The data stream or the sequence of signals may for example be configured so as to be transferred over a data communication link, for example over the Internet.

A further example embodiment comprises a processing device, for example a computer or a programmable logic component, which is configured or adapted so as to carry out one of the methods described herein.

A further example embodiment comprises a computer on which the computer program for carrying out one of the methods described herein is installed.

In the case of some example embodiments, a programmable logic component (for example a field-programmable gate array, an FPGA) may be used to carry out some or all of the functionalities of the methods described herein. In the case of some example elements, a field-programmable gate array may interact with a microprocessor in order to carry out one of the methods described herein. Generally, in the case of some example embodiments the methods are carried out by any desired hardware device. This may be universally usable hardware such as a computer processor (CPU) or hardware that is specific to the method, such as for example an ASIC.

The example embodiments described above merely represent an illustration of the principles of the present disclosure. It goes without saying that modifications and variations of the arrangements and details described herein will become apparent to other persons skilled in the art. For this reason, it is intended that the disclosure is only restricted by the scope of protection of the following patent claims and not by the specific details that have been presented herein on the basis of the description and the explanation of the example embodiments.

What is claimed:

1. A memory device, comprising:
   a memory with first memory cells and second memory cells, which are different from the first memory cells, in the first memory cells there being stored a first bit sequence and in the second memory cells there being stored a second bit sequence; and
   a memory controller configured to:
     check the first bit sequence with a frequency assigned to the first memory cells, wherein the frequency that is assigned to the first memory cells is dependent on an item of reliability information associated with the first memory cells,
     in the case of an error state due to the check of the first bit sequence, correct an erroneous bit of the first bit sequence and write at least the corrected bit back into the memory, and
     check the second bit sequence with a frequency assigned to the second memory cells, wherein the frequency that is assigned to the second memory cells is dependent on an item of reliability information associated with the second memory cells,
   wherein the reliability information for the first memory cells is based on a probability (P) of an occurrence of a bit error in the first memory cells, and wherein the reliability information for the second memory cells is based on a probability (P) of an occurrence of a bit error in the second memory cells.

2. The memory device as claimed in claim 1, wherein the memory controller is configured to overwrite the erroneous bit with a corrected bit and not to overwrite at least one error-free bit in the first or second bit sequence.

3. The memory device as claimed in claim 1, wherein the memory controller is configured to correct the first or second bit sequence and refrain from buffering the first or second bit sequence in a non-volatile memory.

4. The memory device as claimed in claim 1, wherein the frequency assigned to the first memory cells is different than the frequency assigned to the second memory cells.

5. The memory device as claimed in claim 1, wherein the memory comprises a magnetoresistive random access memory (MRAM), a resistive random access memory (RRAM) or a phase-change random access memory (PC-RAM).

6. The memory device as claimed in claim 1, wherein the memory controller is configured to, on the basis of the reliability information for the second memory cells, exclude the second bit sequence from a check.

7. The memory device as claimed in claim 1, wherein the memory controller is also configured to, in the case of an error state, correct an erroneous bit of the second bit sequence and write the corrected bit back into the memory.

8. The memory device as claimed in claim 1, wherein the memory controller is configured to determine the reliability information for the first and/or second memory cells based on a physical parameter.

9. The memory device as claimed in claim 8, wherein the value of the at least one physical parameter is the value of a writing current, the value of a reading current and/or a thermal stability ($\Delta E$) of the first memory cells or the second memory cells.

10. The memory device as claimed in claim 1, wherein the memory comprises an addressable memory,
    the addressable memory having the first memory cells, which are addressed by a first address, and the second memory cells, which are addressed by a second address, which is different from the first address, and
    the first and second bit sequences stored under the first address and the second address in the error-free case respectively being bits of a code word (w) of an error-correcting code ($C_{cor}$).

11. The memory device as claimed in claim 10, wherein the memory controller is configured to correct an erroneous first bit sequence that is stored under the first address, and read out, by using the error-correcting code ($C_{cor}$) and overwrite the erroneous first bit sequence with a corrected bit sequence.

12. The memory device as claimed in claim 10, the error correcting code ($C_{cor}$) comprising a t-bit-correcting code and t≥2, wherein the memory controller is configured to correct an erroneous bit sequence stored under the first address, and read out the corrected bit sequence, that has a number of a errors by using the error-correcting code ($C_{cor}$) and overwrite the erroneous bit sequence with a corrected bit sequence and/or write back the corrected bit sequence, where 1 <σ≤t.

13. The memory device as claimed in claim 12, wherein the memory controller is configured to, on the basis of an error correction threshold value τ, not overwrite the erroneous bit sequence with a corrected bit sequence and not write back the corrected bit sequence if the read-out bit sequence has a number of σ errors and if σ≤τ and 1≤τ≤t.

14. The memory device as claimed in claim 10, wherein the bit sequence is stored under the address comprising data bits (u) and check bits (c), the data bits (u) and the check bits (c) and address bits (a) of the first address and/or bits (b) derived from the address bits (a) of the address in the error-free case forming a code word (w) of the error-correcting code ($C_{cor}$).

15. The memory device as claimed in claim 10, wherein:
    the addressable memory having further first memory cells, which are addressed by further first addresses (a1,2, . . . , a1,m with m>1), and further second memory cells, which are addressed by further second addresses (a2,2, . . . , a2, M with M>1);

the first memory cells and the further first memory cells forming a total set of first memory cells, the total set of first memory cells being addressable by a first subset of addresses ($\alpha 1 = \{a1,1, \ldots, a1, m\}$ with m≥1);

the second memory cells and the further second memory cells forming a total set of second memory cells, the total set of second memory cells being addressable by a second subset of addresses ($\alpha 2 = \{a2,1, \ldots, a2, M\}$ with M≥1);

in order to check bit sequences stored in the total set of first memory cells with the frequency assigned to the first memory cells, in order in the case of an error state to correct an erroneous bit of the stored bit sequence and write at least the corrected bit back into the memory, and bit sequences stored under the total set of second memory cells being checked less often than the bit sequences stored in the total set of first memory cells on the basis of the reliability information for the second memory cells.

16. The memory device as claimed in claim 15, wherein the memory controller is configured to determine the first subset ($\alpha 1$) during a start-up of the memory device.

17. The memory device as claimed in claim 15, wherein the memory controller is configured to change the first subset ($\alpha 1$) of addresses in dependence on errors occurring when reading out bit sequences stored in the addressable memory and/or in dependence on values of a physical parameter (i; $\Delta E$) determined when writing into the addressable memory and/or when reading out from the memory.

18. The memory device as claimed in claim 17, wherein:
the bit sequences that are stored under the first subset ($\alpha 1$) of addresses are bits of a t-bit-error-identifying and error-correcting code with t≥1, and
the memory controller is configured to read out an address (a2,1 . . . ,a2,M with M>1) of the second subset ($\alpha 2$) and to assign the address to the first subset ($\alpha 1$) of addresses if, when reading out the stored bit sequence for a predetermined $\tau$, the memory controller identifies a number of at least a errors in the read-out bit sequence, where $1 \leq \tau \leq \sigma \leq t$.

19. The memory device as claimed in claim 15, wherein:
the addressable memory comprises memory cells that are addressable by a third subset (aper) of addresses, and
the memory controller is configured to store a bit sequence to be stored at least partially bitwise-inverted in memory cells that are addressed by the third subset (aper) of addresses.

20. The memory device as claimed in claim 10, wherein:
the addressable memory comprises third memory cells, which are addressed by a third address (a3,1),
a third bit sequence is stored under the third address (a3,1), in the error-free case comprising bits of a code word of the error-correcting code ($C_{cor}$),
the memory controller is configured to check the second bit sequence with a frequency assigned to the second memory cells and check the third bit sequence with a frequency assigned to the third memory cells,
the frequency assigned to the first memory cells, the frequency assigned to the second memory cells and the frequency assigned to the third memory cells are different on the basis of the reliability information for the first memory cells, on the basis of the reliability information for the second memory cells and on the basis of the reliability information for the third memory cells.

21. The memory device as claimed in claim 1, further comprising an address value memory configured to store an address bit sequence comprising the bits of the first address (a1,1), wherein the bits of the first address are stored redundantly in the address value memory, so that at least a number of 1 error in the redundantly stored address bits of the address (a1,1) is identifiable and/or correctable.

22. The memory device as claimed in claim 1, wherein the memory controller is configured to replace the first address (a1,1) and/or the second address (a2,1) by another address by means of a repair process.

23. The memory device as claimed in claim 1, wherein the memory comprises a resistance-based memory and/or a magnetoresistive memory.

24. A memory device, comprising:
a memory with first memory cells and second memory cells, which are different from the first memory cells, in the first memory cells there being stored a first bit sequence and in the second memory cells there being stored a second bit sequence,
a memory controller configured to:
check the first bit sequence with a frequency assigned to the first memory cells, wherein the frequency that is assigned to the first memory cells is dependent on an item of reliability information associated with the first memory cells,
in the case of an error state due to the check of the first bit sequence, correct an erroneous bit of the first bit sequence and write at least the corrected bit back into the memory, and
check the second bit sequence with a frequency (x2/T) assigned to the second memory cells, or exclude the second bit sequence from a check based on the reliability information associated with the second memory cells,
wherein the reliability information for the first memory cells is based on a probability (P) of an occurrence of a bit error in the first memory cells, and wherein the reliability information for the second memory cells is based on a probability (P) of an occurrence of a bit error in the second memory cells.

25. The memory device as claimed in claim 24, wherein the second bit sequence check frequency is less than the first bit sequence check frequency based on the reliability information for the second memory cells.

26. A method, comprising:
checking a first bit sequence using a processor circuit, which is stored in first memory cells of a memory, the memory having second memory cells, which are different from the first memory cells and in which there is stored a second bit sequence;
wherein the first bit sequence is checked with a frequency assigned to the first memory cells that depends on an item of reliability information associated with the first memory cells, and wherein in the case of an error state due to the check of the first bit sequence an erroneous bit of the first bit sequence is corrected and at least the corrected bit being written back into the memory; and
wherein the second bit sequence is checked at a frequency that is less than the frequency of the first bit sequence based on an item of reliability information associated with the second memory cells,
wherein the reliability information for the first memory cells is based on a probability (P) of an occurrence of a bit error in the first memory cells, and wherein the reliability information for the second memory cells is based on a probability (P) of an occurrence of a bit error in the second memory cells.

27. The method as claimed in claim 26, the first bit sequence being at least part of a code word (w) of a t-bit-error-correcting code ($C_{cor}$) and t≥2, the error state existing if there are at least a bit errors in the first or second bit sequence, it being the case that σ>τ and T being an error threshold value with τ≥1, the corrected bit sequence not being written back if the error state does not exist.

28. The method as claimed in claim 26, an error-free bit of the first bit sequence not being written back into the memory.

* * * * *